(12) United States Patent
Shiino et al.

(10) Patent No.: US 9,472,295 B2
(45) Date of Patent: *Oct. 18, 2016

(54) NONVOLATILE SEMICONDUCTOR MEMORY DEVICE

(71) Applicant: KABUSHIKI KAISHA TOSHIBA, Minato-ku (JP)

(72) Inventors: Yasuhiro Shiino, Yokohama (JP); Eietsu Takahashi, Yokohama (JP); Koki Ueno, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/677,111

(22) Filed: Apr. 2, 2015

(65) Prior Publication Data
US 2015/0213903 A1    Jul. 30, 2015

Related U.S. Application Data

(63) Continuation of application No. 14/088,744, filed on Nov. 25, 2013, now Pat. No. 9,025,387, which is a continuation of application No. 13/749,029, filed on Jan. 24, 2013, now Pat. No. 8,649,221, which is a continuation of application No. 13/246,004, filed on Sep. 27, 2011, now Pat. No. 8,385,126.

(30) Foreign Application Priority Data

Apr. 6, 2011 (JP) .................................. 2011-084762

(51) Int. Cl.
*G11C 16/04* (2006.01)
*G11C 16/26* (2006.01)
(Continued)

(52) U.S. Cl.
CPC ........... *G11C 16/26* (2013.01); *G11C 11/5628* (2013.01); *G11C 16/0483* (2013.01); *G11C 16/349* (2013.01); *G11C 16/3427* (2013.01)

(58) Field of Classification Search
CPC .............. G11C 11/5628; G11C 16/26; G11C 16/0483; G11C 16/349; G11C 16/3427

USPC ............. 365/185.18, 185.19, 184, 149, 155, 365/182, 185.23
See application file for complete search history.

(56) References Cited

U.S. PATENT DOCUMENTS 6,879,520 B2    4/2005   Hosono et al.
8,270,218 B2    9/2012   Maejima
(Continued)

FOREIGN PATENT DOCUMENTS

JP          3-216894        9/1991
JP       2006-172630 A      6/2006
(Continued)

OTHER PUBLICATIONS

Japanese Office Action issued Apr. 23, 2013 in Patent Application No. 2011-084762 with English Translation.
(Continued)

*Primary Examiner* — Gene Auduong
(74) *Attorney, Agent, or Firm* — Oblon, McClelland, Maier & Neustadt, L.L.P.

(57) ABSTRACT

A nonvolatile semiconductor memory device according to one embodiment of the present invention includes: a memory cell array and a control circuit. The control circuit executes a first reading operation and a second reading operation. The first reading operation is an operation of reading a threshold voltage set in the selected memory cell by setting a voltage between a control gate electrode and source of the selected memory cell to a first value. The second reading operation is an operation of reading a threshold voltage set in the selected memory cell by setting a voltage between the control gate electrode and source of the selected memory cell to a second value lower than the first value. When executing the second reading operation, the control circuit keeps a voltage of the control gate electrode of the selected memory cell to 0 or a positive value.

20 Claims, 13 Drawing Sheets

(51) Int. Cl.
  *G11C 11/56* (2006.01)
  *G11C 16/34* (2006.01)

(56) References Cited

U.S. PATENT DOCUMENTS

| | | |
|---|---|---|
| 8,406,049 B2 | 3/2013 | Nawata |
| 9,025,387 B2 * | 5/2015 | Shiino .................... G11C 16/26 365/185.18 |
| 9,064,108 B2 * | 6/2015 | Nagai ..................... G06F 21/44 |
| 2009/0244969 A1 | 10/2009 | Maejima |
| 2010/0091578 A1 | 4/2010 | Kim et al. |

FOREIGN PATENT DOCUMENTS

| | | |
|---|---|---|
| JP | 2009-230818 | 10/2009 |
| JP | 2010-55746 A | 3/2010 |
| JP | 2010-539630 A | 12/2010 |
| JP | 2011-100519 | 5/2011 |
| WO | WO 2011/055749 A1 | 5/2011 |

OTHER PUBLICATIONS

Office Action issued Jul. 23, 2013, in Japanese Patent Application No. 2011-084762 with English translation.

* cited by examiner (First Reading Operation)    (Second Reading Operation)

Effect obtained by Changing Source Line SRC Voltage from 0 V to Vsrc

Effect Obtained by Changing Source Line SRC Voltage from 0 V to Vsrc' (>Vsrc)

Effect Obtained by Changing Source Line
SRC Voltage from 0 V to Vsrc + Effect
Obtained by Changing Reading Pass
Voltage of Adjoining Memory Cells Effect Obtained by Changing
Reading Pass Voltage of
Adjoining Memory Cells

NONVOLATILE SEMICONDUCTOR MEMORY DEVICE

CROSS REFERENCE TO RELATED APPLICATION

This application is a continuation of and claims the benefit of priority under 35 U.S.C. §120 from U.S. Ser. No. 14/088,744, filed Nov. 25, 2013, now U.S. Pat. No. 9,025,387, which is a continuation of U.S. Ser. No. 13/749,029, filed Jan. 24, 2013, now U.S. Pat. No. 8,649,221, which is a continuation of U.S. Ser. No. 13/246,004, filed Sep. 27, 2011, now U.S. Pat. No. 8,385,126 and is based upon and claims the benefit of priority from prior Japanese Patent Application No. 2011-84762, filed on Apr. 6, 2011, the entire contents of which are incorporated herein by reference.

BACKGROUND

1. Field

Embodiments described herein relate to an electrically-rewritable nonvolatile semiconductor memory device.

2. Description of the Related Art

A NAND type flash memory has a memory cell array which is configured by arranging memory strings each including a plurality of memory cells connected in series. Both ends of each memory string are connected to a bit line and a source line through select transistors respectively. The control gate electrodes of the memory cells of each memory string are connected to different word lines respectively. In each memory string, the plurality of memory cells are connected in series with sources and drains shared between them. The NAND type flash memory can have a small unit memory cell size, because select transistors and their bit line contacts and source line contacts are shared among a plurality of memory cells. Further, the NAND type flash memory is suitable for miniaturization, because the word lines and the device regions of the memory cells have a shape that resembles a simple stripe shape, and hence a flash memory having a large capacity is realized.

As the miniaturization of NAND type flash memories progresses, interference between adjoining cells and influence due to elapse of time after data writing increase, which might change the memory cell data. For example, when data written in a memory cell remains un-accessed for a long time, there occurs a phenomenon that electrons are discharged from the charge accumulation layer of the memory cell, changing the threshold voltage of the memory cell to a lower value. Hereinafter, this phenomenon will be referred to as deterioration of data retention. If deterioration of data retention occurs, a data reading operation may fail.

DETAILED DESCRIPTION

A nonvolatile semiconductor memory device according to one embodiment of the present invention includes: a memory cell array including memory strings each including a plurality of memory cells connected in series, a first select transistor connected to one end of each memory string, a second select transistor connected to the other end of each memory string, bit lines connected to the memory strings through the first select transistors, a source line connected to the memory strings through the second select transistors, and word lines connected to control gate electrodes of the memory cells; and a control circuit configured to execute a reading operation of applying a reading voltage to the control gate electrode of a selected memory cell in a memory string to read data and applying a reading pass voltage to non-selected word lines connected to non-selected memory cells in the memory string to thereby determine whether or not the selected memory cell becomes conductive. The control circuit is configured to be capable of executing a first reading operation and a second reading operation. The first reading operation is an operation of reading a threshold voltage set in the selected memory cell by setting a voltage between the control gate electrode and source of the selected memory cell to a first value. The second reading operation is an operation of reading a threshold voltage set in the selected memory cell by setting a voltage between the control gate electrode and source of the selected memory cell to a second value lower than the first value. When executing the second reading operation, the control circuit sets the voltage between the control gate electrode and source to the second value while keeping a voltage of the control gate electrode of the selected memory cell to 0 or a positive value.

Next, a nonvolatile semiconductor memory device according to the embodiments will be explained with reference to the drawings.

First Embodiment

Configuration

Figure 1:
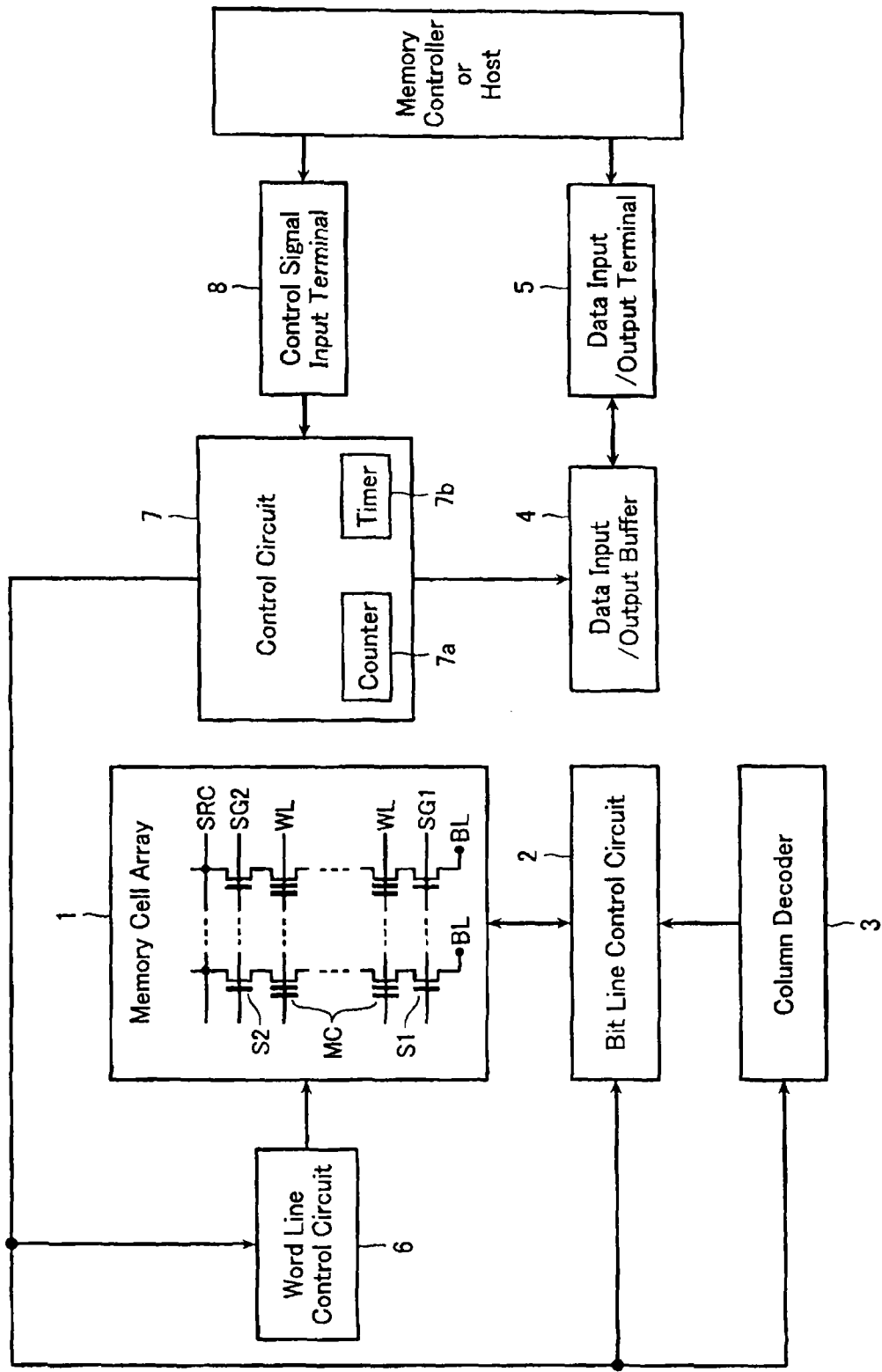
FIG. 1 is a block diagram showing a schematic configuration of a nonvolatile semiconductor memory device according to an embodiment.

FIG. 1 is a block diagram showing a configuration of a nonvolatile semiconductor memory device according to a first embodiment. The nonvolatile semiconductor memory device is a NAND type flash memory employing a four-value storing system. The nonvolatile semiconductor memory device includes a memory cell array 1 configured by disposing memory cells MC for storing data in a matrix arrangement. The memory cell array 1 includes a plurality of bit lines BL, a plurality of word lines WL, a source line SRC, and a plurality of memory cells MC. The memory cells MC are electrically-rewritable, and disposed at the intersections of the bit lines BL and word lines WL in a matrix arrangement.

The memory cell array 1 is connected to a bit line control circuit 2 configured to control the voltages of the bit lines BL and a word line control circuit 6 configured to control the voltages of the word lines WL. That is, the bit line control circuit 2 reads data of a memory cell MC in the memory cell array 1 through a bit line BL. The bit line control circuit 2 also writes data in a memory cell MC in the memory cell array 1 through a bit line BL.

The bit line control circuit 2 is connected to a column decoder 3, a data input/output buffer 4, and a data input/output terminal 5. Data of a memory cell MC read out from the memory cell array 1 is output to external through the data input/output terminal 5. Write data sent from external (i.e. a memory controller or a host) and input to the data input/output terminal 5 is input to the bit line control circuit 2 by the column decoder 3, and written into a designated memory cell MC.

The memory cell array 1, the bit line control circuit 2, the column decoder 3, the data input/output buffer 4, and the word line control circuit 6 are connected to a control circuit 7. In accordance with control signals input to a control signal input terminal 8 from a memory controller or a host, the control circuit 7 generates control signals for controlling the bit line control circuit 2, the column decoder 3, the data input/output buffer 4, and the word line control circuit 6. The control circuit 7 may include a counter 7a for counting the number of times writing operations is executed and the number of times erasing operations is executed, and a timer 7b for counting the cumulative time spent on operations.

Figure 2:
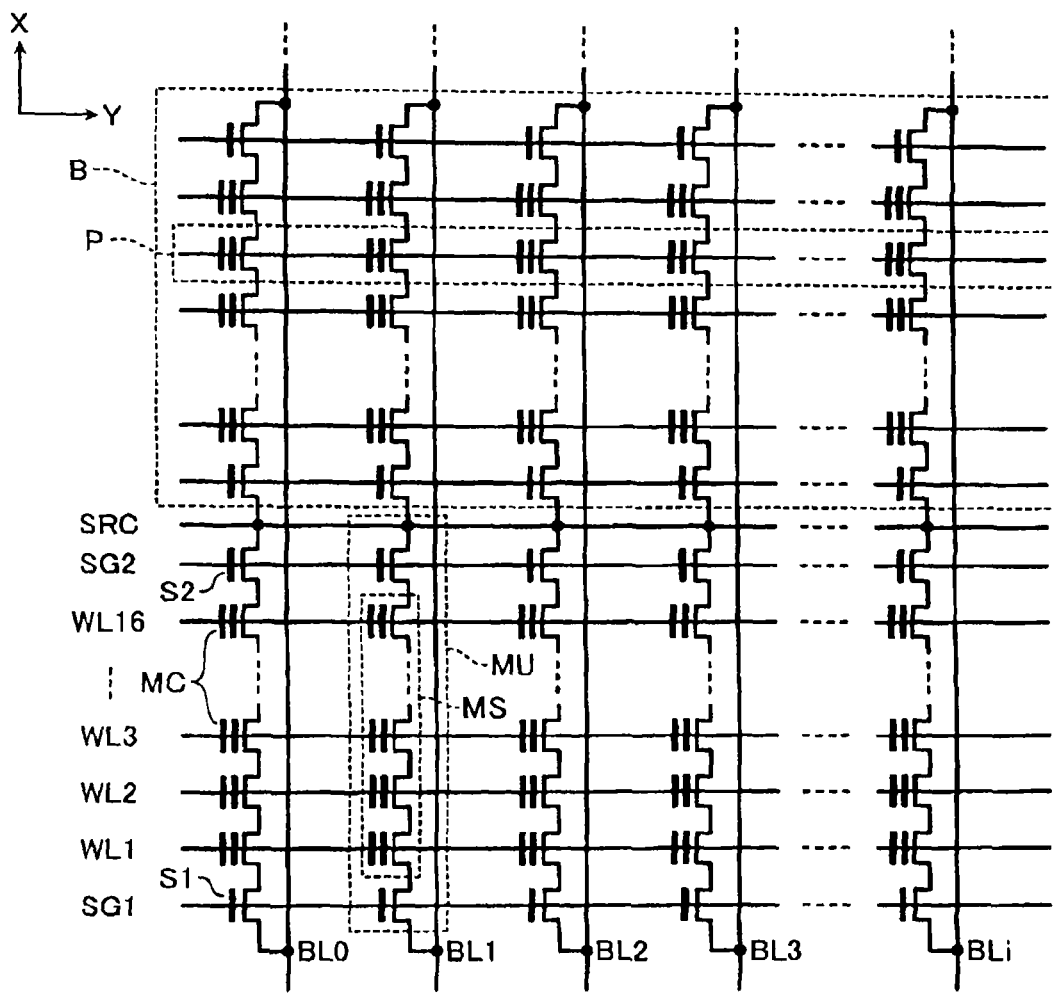
FIG. 2 is a circuit diagram showing a configuration of a memory cell array 1 of a nonvolatile semiconductor memory device according to an embodiment.

FIG. 2 is a circuit diagram showing a configuration of the memory cell array 1 shown in FIG. 1. As shown in FIG. 2, the memory cell array 1 is configured by a plurality of blocks B. In the memory cell array 1, data is erased on a block B basis (a block erasing process).

As shown in FIG. 2, a block B is configured by a plurality of memory units MU. One memory unit MU is configured by a memory string MS including, for example, sixteen memory cells MC connected in series, and first and second select transistors S1 and S2 connected to both ends of the memory string MS. One end of the first select transistor S1 is connected to the bit line BL, and one end of the second select transistor S2 is connected to the source line SRC. The control gate electrodes of memory cells MC arranged in line in the Y direction are connected commonly to any of the word lines WL1 to WL16. The control gate electrodes of the first select transistors S1 arranged in line in the Y direction are connected commonly to a select line SG1, and the control gate electrodes of the second select transistors S2 arranged in line in the Y direction are connected commonly to a select line SG2. An aggregate P of a plurality of memory cells MC connected to one word line WL constitutes one page or a plurality of pages. Writing or reading of data is executed on the aggregate P basis.

Data Storage

Next, an outline of a data storing scheme of the nonvolatile semiconductor memory device will be explained with reference to FIG. 3. In the nonvolatile semiconductor memory device according to the present embodiment, the threshold voltage of the memory cells MC can have, for example, four distributions.

Figure 3:
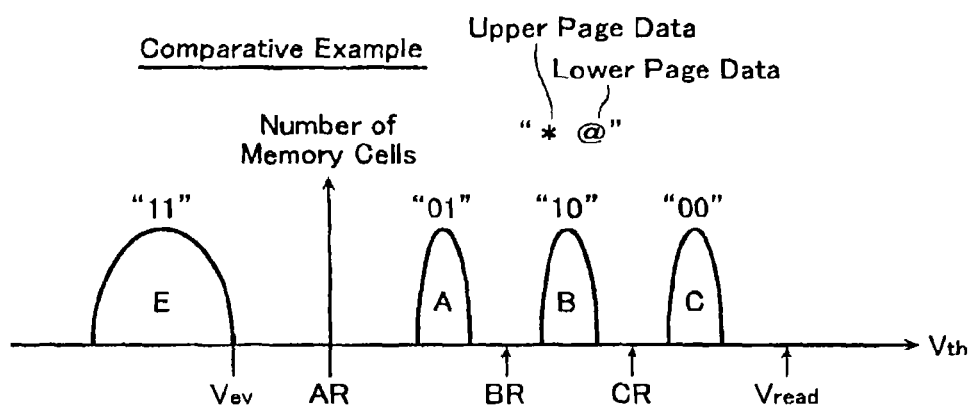
FIG. 3 is a diagram showing an example of data storage in a flash memory for storing four values.

FIG. 3 shows a relationship between two-bit four-value data (data "11", "01", "10", and "00") to be stored in the memory cells MC of the nonvolatile semiconductor memory device and the threshold voltage distributions of the memory cells MC. In FIG. 3, reading voltages AR, BR, and CR are voltages to be applied to the control gate of a selected memory cell MC (or a selected word line WL) which is selected when reading four value data. A reading pass voltage Vread is a voltage which, in a data reading operation, is applied to the control gates of non-selected memory cells MC (or non-selected word lines WL) in a memory string MS for making the non-selected memory cells MC conductive regardless of the data retained therein. A voltage Vev is an erasing verify voltage which, when erasing data from the memory cells MC, is applied to the memory cells MC in order to verify whether or not the erasing is completed.

The threshold voltage distribution E of the memory cells MC after block erasing is assigned data "11". Memory cells MC showing data "01", "10", and "00" representing written states are assigned threshold voltage distributions A, B, and C, respectively. The threshold voltage distribution A of the data "01" has the lowest voltage, the threshold voltage distribution C of the data "00" has the highest voltage, and the threshold voltage distribution B of the data "10" has an intermediate voltage between the threshold voltage distributions A and C. As shown in FIG. 3, two-bit data stored in one memory cell MC is composed of lower page data and upper page data. When data is represented as "*@", "*" represents upper page data and "@" represents lower page data.

Reading Operation

Before the first embodiment will be explained, a reading operation of a nonvolatile semiconductor memory device according to a comparative example will be explained. Normally, when executing a data reading operation, any of the reading voltages AR, BR, and CR is supplied to the word line WL (selected word line WL1) connected to a selected memory cell MC in a memory unit MU. The reading pass voltage Vread is applied to the word lines WL (non-selected word lines WL0, WL2, WL3, . . . ) connected to non-selected memory cells MC. The bit line control circuit 2 determines data by detecting whether or not a current flows through the memory unit MU at this time.

As described above, when data written in a memory cell MC remains un-accessed for a long time, electrons are discharged from the charge accumulation layer of the memory cell MC to change the threshold voltage of the memory cell MC to lower (deterioration of data retention). Influence of this deterioration of data retention will be explained with reference to a comparative example shown in FIG. 4.

Figure 4:
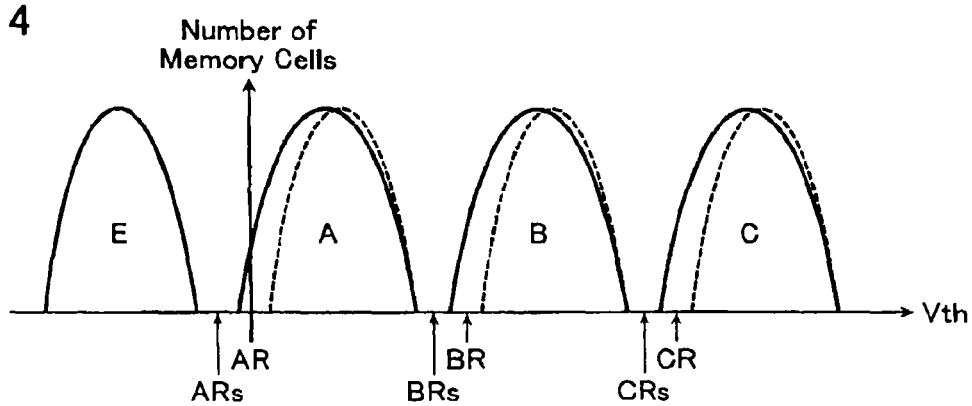
FIG. 4 is a diagram explaining threshold voltage distributions and reading voltages of a reading operation according to a comparative example.

FIG. 4 is a diagram explaining the threshold voltage distributions and reading voltages of a reading operation according to a comparative example. As shown in FIG. 4, due to deterioration of data retention, the threshold voltage distributions (solid lines) of the memory cells MC change to become lower than the threshold voltage distributions (broken lines) which were given when writing. At this time, the lower limit values of the threshold voltage distributions A, B, and C might become lower than the reading voltages AR, BR, and CR, respectively. In this case, a reading operation for reading the threshold voltages of the memory cells MC may fail.

Figure 5:
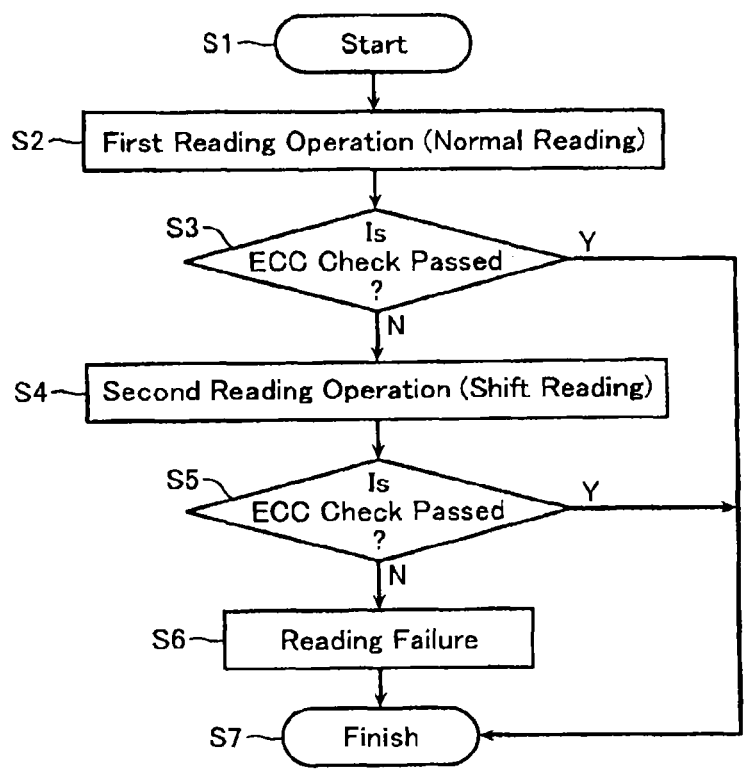
FIG. 5 is a flowchart showing a data reading process according to the comparative example.

One example of a scheme for a reading operation for dealing with deterioration of data retention, and problems involved with this scheme will be explained with reference to the comparative example shown in FIG. 4 to FIG. 6. In order to prevent erroneous reading due to deterioration of data retention, the semiconductor memory device according to the comparative example executes a reading operation (second reading operation) which uses reading voltages different from the reading voltages used in a normal reading operation (first reading operation). That is, when data cannot be read out correctly by the normal reading operation (first reading operation) resulting in many reading errors, a data reading operation (second reading operation) is again executed by changing the voltage to be applied to the selected word line WL from the reading voltages AR, BR, or CR of the normal reading operation to reading voltages ARs (<AR), BRs (<BR), or CRs (<CR), as shown in FIG. 4. The reading voltages ARs, BRs, or CRs are set to values lower than the lower limit values of the threshold voltage distributions broadened at the lower side (shown by solid lines in FIG. 4). Also, the reading voltages ARs, BRs, and CRs are set between the upper limit and the lower limit of the threshold voltage distributions broadened at the lower side. By using such reading voltages ARs, BRs, and CRs, it is possible to execute a data reading operation on the memory cell MC correctly.

A reading operation to be executed by changing the reading voltage to be applied to the selected word line WL from the original voltages AR, BR, or CR to the voltages ARs, BRs, or CRs to lower the voltage between the control gate electrode and source of the selected memory cell MC will be hereinafter referred to as "shift reading operation". Here, the voltage between the control gate electrode and source can be regarded simply as a voltage between the control gate electrode and the source line or a voltage between the control gate electrode and the bit line. Also, "setting the voltage between the control gate electrode and source" can be said to be equivalent to "controlling the voltage of the control gate electrode and the voltage of the source line or the bit line".

The process of a data reading operation according to the comparative example will be explained with reference to FIG. 5 and FIG. 6. First, when a reading signal is input to the control circuit 7, a data reading process is started (step S1). Next, a normal reading operation (first reading operation) using the reading voltages AR, BR, and CR is executed by the control circuit 7 (step S2). After the normal reading operation, ECC check is executed (step S3). When there are few reading errors and error correction is possible, the data reading process is finished, by determining that data reading is executed correctly (step S7).

However, when there are many reading errors and error correction is impossible, the process goes to a second reading operation, by determining that deterioration of data retention occurs (step S4). In the second reading operation, a shift reading operation is executed by changing the voltage applied to the selected word line WL from the normal reading voltages AR, BR, CR to the voltages ARs, BRs, and CRs. After the second reading operation, ECC check is executed (step S5). When there are few reading errors and error correction is possible, the reading process is finished, by determining that data reading is executed correctly (step S7). However, when even the second reading operation results in many reading errors and error correction is impossible, the reading process is finished, by determining that data reading fails (step S6 and step S7).

Figure 6:
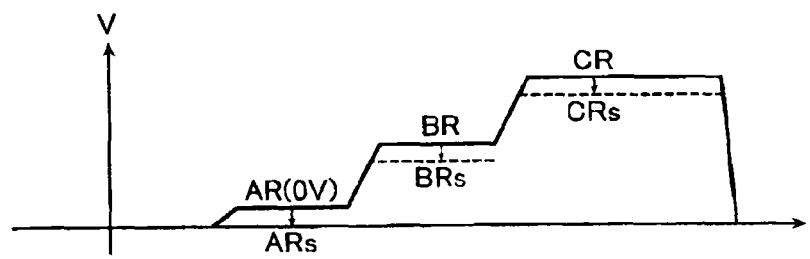
FIG. 6 is a diagram explaining voltages of a reading operation according to the comparative example.

FIG. 6 is a diagram explaining the voltage to be applied to a selected word line WL in a reading operation. In a normal reading operation (first reading operation), the reading voltages AR, BR, or CR is applied as a reading voltage to be applied to the selected word line WL.

In a second reading operation, a shift reading operation is executed by changing the reading voltage to the voltages ARs (<AR), BRs (<BR), or CRs (<CR). Here, when the threshold voltage distribution E is a distribution having negative threshold voltage values and the threshold voltage distributions A, B, and C are distributions having positive threshold voltage values, there can be a case when the reading voltage ARs in a shift reading operation has to be set to a negative voltage value, depending on the value of the original reading voltage AR. However, in order to set a negative reading voltage, it is necessary to provide a voltage generating circuit for generating a negative voltage, which leads to problems that the area of the peripheral circuits is increased, that the power consumption of the peripheral circuits is increased, or the like.

Reading Operation According to First Embodiment

In consideration of the problems of the shift reading operation according to the comparative example described above, the nonvolatile semiconductor memory device according to the present embodiment executes a reading operation explained below. The reading operation according to the present embodiment will now be explained with reference to FIG. 7 to FIG. 10.

Figure 7:
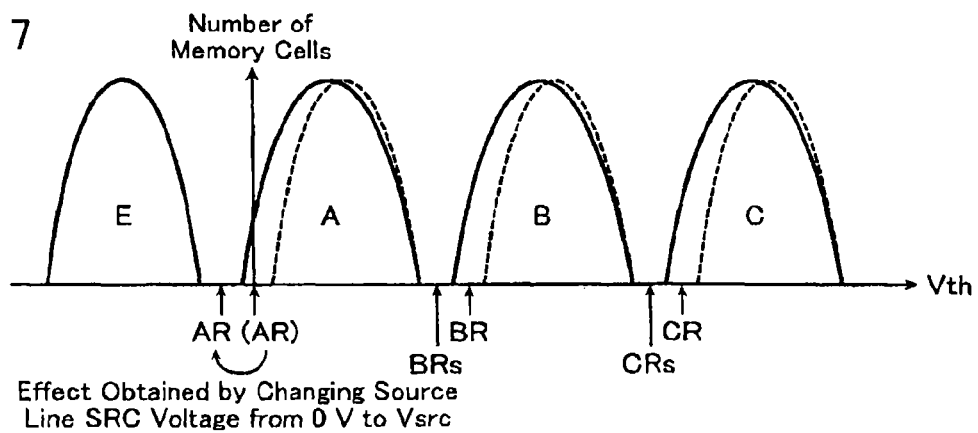
FIG. 7 is a diagram explaining threshold voltage distributions and reading voltages of a reading operation according to a first embodiment.

As shown in FIG. 7, in a second reading operation after a first reading operation fails, a shift reading operation is executed by changing the reading voltage to be applied to the selected word line WL from the normal reading voltages BR or CR to the voltages BRs or CRs, which is the same as in the comparative example. Since the voltages BRs and CRs are both positive voltages, there is no problem with executing the shift reading operation.

On the other hand, in a second reading operation for determining whether the threshold voltage of a memory cell is included in the threshold voltage distribution E, or in any of the threshold voltage distributions A to C, no shift reading operation is executed. That is, in the second reading operation, the reading voltage to be applied to the word line WL is not changed from the normal reading voltage AR to the voltage ARs, but the reading voltage AR is used. Instead, the voltage of the source line SRC is raised from 0 V to a voltage Vsrc (>0). This is for lowering the voltage between the control gate electrode and source of the selected memory cell MC. In terms of the voltage between the control gate electrode and source, raising the voltage of the source line SRC from 0 V to Vsrc is equivalent to lowering the voltage of the control gate electrode (the selected word line WL) from AR to ARs. Therefore, raising the voltage of the source line SRC from 0 V to Vsrc results in the same state as resulting from executing shift reading by lowering the voltage AR (see FIG. 7).

Figure 8:
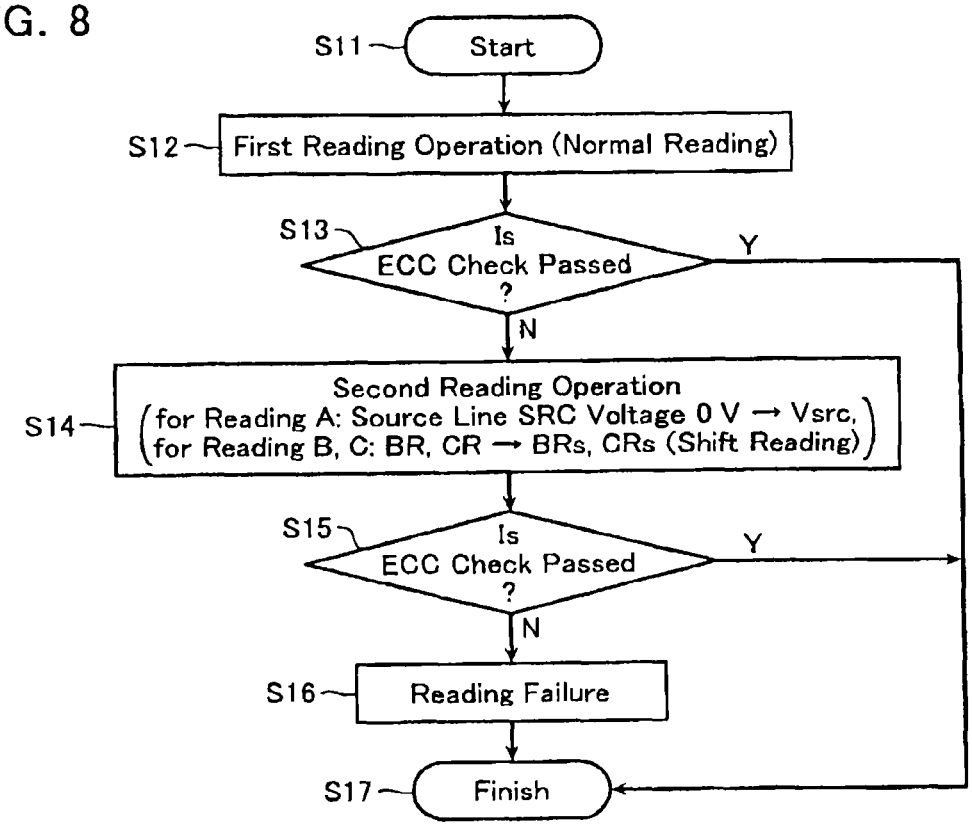
FIG. 8 is a flowchart showing a data reading process according to the first embodiment.

The process of the data reading operation according to the present embodiment will be explained with reference to FIG. 8. Step S11 to step S13 (first reading operation, or the like.) of FIG. 8 are the same as corresponding step S1 to step S3 according to the comparative example shown in FIG. 5. In a second reading operation after the first reading operation fails, the same shift reading operation as in the comparative example is executed by changing the voltage to be applied to the selected word line WL from the reading voltages BR or CR to the voltages BRs or CRs (step S14). However, in the second reading operation according to the present embodiment, reading operation is executed by not changing the reading voltage AR to the voltage ARs, but instead by raising the voltage of the source line SRC from 0 V to the voltage Vsrc (step S14). Note that the value of a well voltage Vwell used in step S14 is equal to the voltage Vsrc.

After the second reading operation, ECC check is executed (step S15). When there are few reading errors and error correction is possible, the reading process is finished by determining that data reading is executed correctly (step S17). However, when even the second reading operation results in many reading errors and error correction is impossible, the reading process is finished by determining that data reading fails (step S16 and step S17).

Figure 9:
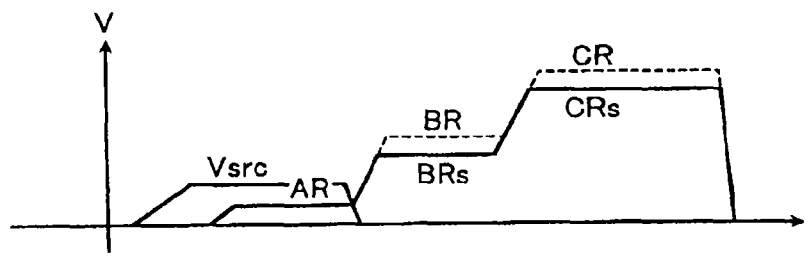
FIG. 9 is a diagram explaining voltages of a reading operation according to the first embodiment.

FIG. 9 is a diagram explaining the voltages to be applied in a reading operation. In a normal reading operation (first reading operation), the reading voltages AR, BR, or CR is applied to the selected word line WL.

On the other hand, in a second reading operation to be executed when correct reading is impossible by the first reading operation, the voltage between the control gate electrode and source of the selected memory cell MC is set to a value lower than that in the first reading operation. In this way, the threshold voltage set in the selected memory cell MC is readout. In this case, the reading voltages BR and CR are changed to the voltages BRs and CRs respectively, and a shift reading operation is executed.

Here, the reading voltage AR is not changed to the voltage ARs. That is, in a reading operation for determining whether the threshold voltage is in the distribution E or in any of the distributions A, B, and C, no shift reading operation is executed. Instead, the voltage of the source line SRC is raised from 0 V to the voltage Vsrc, thereby the voltage between the control gate electrode and source is set to a value lower than the voltage in the first reading operation (step S12). In this case, even in the second reading operation, the voltage of the control gate electrode of the selected memory cell MC is kept at 0 or a positive value.

Figure 10:
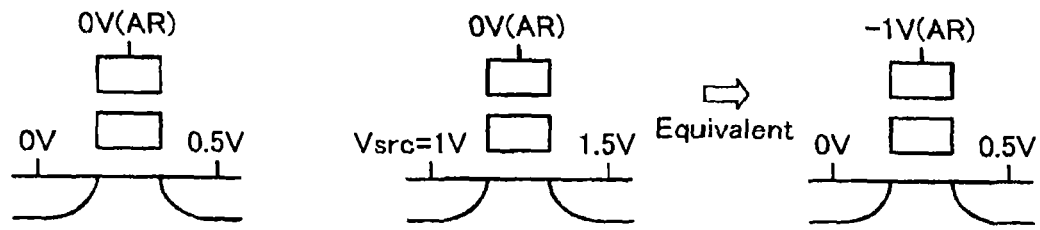
FIG. 10 is a diagram explaining voltages of a reading operation according to the first embodiment.

FIG. 10 is a diagram showing states when the voltage AR is applied to the control gate electrode of the selected memory cell MC in a data reading operation. FIG. 10 shows a cross-sectional view of the selected memory cell MC. In a first reading operation, the voltage AR is applied to the selected word line WL. Further, for example, 0 V is supplied as a source line voltage to the source of the selected memory cell MC, and the voltage of the bit line BL (for example, 0.5 V) is supplied to the drain of the selected memory cell MC. Based on whether the selected memory cell MC becomes conductive at this time, the threshold of the selected memory cell MC is detected. On the other hand, in a second reading operation, the voltage AR of the selected memory cell MC is not changed, but is kept at, for example, 0 V. Then, the source is raised to the voltage Vsrc (for example, 1 V), thereby the voltage between the control gate electrode and source is changed from what it is in the first reading operation. This voltage application state is equivalent to a state when reading operation is executed by applying a negative voltage to the selected word line WL.

Effect

In the reading operation according to the present embodiment, when deterioration of data retention occurs and the threshold voltage distributions broaden at the lower side, a shift reading operation is executed by changing the values of the reading voltages BR and CR to the voltages BRs and CRs. On the other hand, the value of the reading voltage AR is not changed (or not set to a negative value), but reading operation is executed by raising the voltage of the source line SRC from 0 V to the voltage Vsrc. By employing such a data reading scheme in the second reading operation executed after deterioration of data retention occurs, it is possible to execute a data reading operation on the memory cell MC correctly. In addition, since the voltage to be applied to the selected memory cell MC need not to be a negative value, voltage control in the reading operation becomes easier.

Furthermore, a shift reading operation is executed for the threshold voltage distributions B and C which are less likely to become a negative threshold voltage at their lower side due to deterioration of data retention. Hence, a positive voltage is not applied to the source line SRC in a reading operation for the threshold voltage distributions B and C, which leads to less power consumption and a higher operation speed.

Second Embodiment

Figure 11:
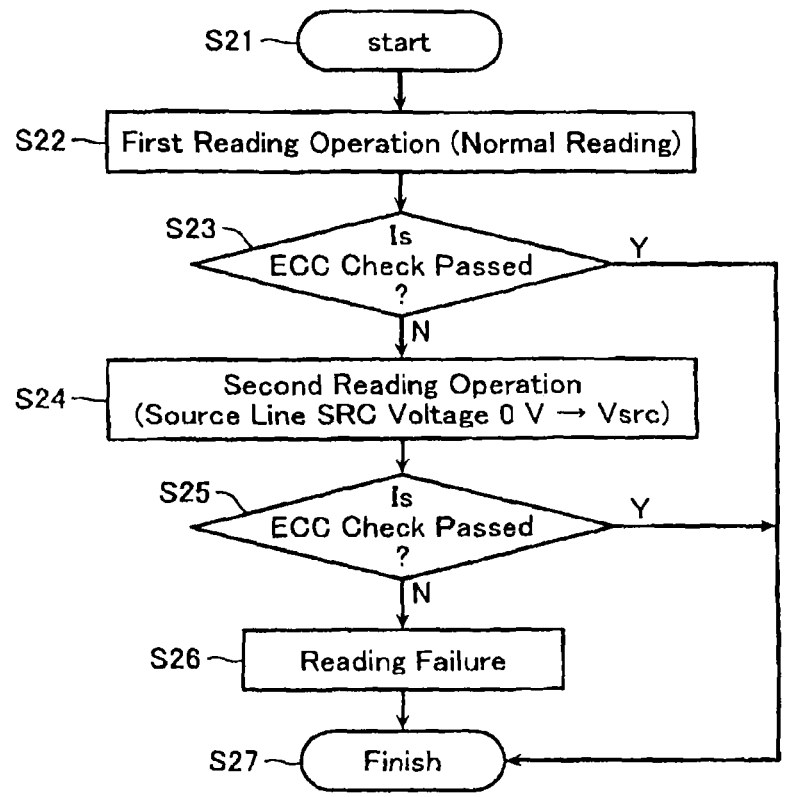
FIG. 11 is a flowchart showing a data reading process according to a second embodiment.

Next, a nonvolatile semiconductor memory device according to a second embodiment will be explained with reference to FIG. 11 and FIG. 12. The whole configuration of the nonvolatile semiconductor memory device according to the present embodiment is the same as the first embodiment, and hence a detailed explanation thereof will not be provided here. Further, any portions that are configured the same as the first embodiment will be denoted by the same reference numerals, and a redundant explanation thereof will not be provided.

In the second reading operation according to the first embodiment, a reading operation is executed by changing the voltage to be applied to the selected word line WL from the reading voltages BR or CR to the voltages BRs or CRs to execute a shift reading operation, and by not changing the reading voltage AR to the voltage ARs but instead raising the voltage of the source line SRC from 0 V to the voltage Vsrc. In contrast, in the second reading operation according to the present embodiment, a reading operation is executed by keeping all of the reading voltages AR, BR, and CR unchanged and raising the voltage of the source line SRC from 0 V to the voltage Vsrc regardless of the voltage to be applied to the selected word line WL. Explanation will now be given with reference to FIG. 11 and FIG. 12.

The process of the data reading operation according to the present embodiment will be explained with reference to FIG. 11. Step S21 to step S23 of FIG. 11 are the same as corresponding step S11 to step S13 according to the first embodiment shown in FIG. 8. In the second reading operation according to the present embodiment, reading operation is executed by using the reading voltages AR, BR, and CR as they are without changing them as in the first reading operation, but instead by raising the voltage of the source line SRC from 0 V to the voltage Vsrc regardless of which of the voltages AR, BR, and CR is to be applied to the selected word line WL (step S24). Note that the voltage of a well voltage Vwell used in step S24 is equal to the voltage Vsrc.

After the second reading operation, ECC check is executed (step S25). When there are few reading errors and error correction is possible, the reading process is finished by determining that data reading is executed correctly (step S27). However, when even the second reading operation results in many reading errors and error correction is impossible, the reading process is finished by determining that data reading fails (step S26 and step S27).

Figure 12:
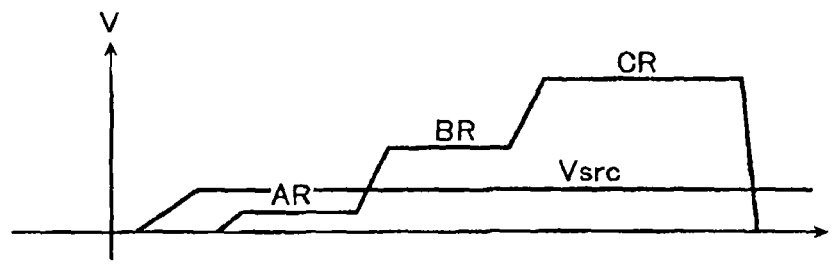
FIG. 12 is a diagram explaining voltages of a reading operation according to the second embodiment.

FIG. 12 is a diagram explaining the voltages to be applied in a reading operation. In the normal reading operation (first reading operation), the reading voltages AR, BR, or CR is applied to the selected word line WL. Also according to the present embodiment, in the second reading operation, the voltage between the control gate electrode and source of the selected memory cell MC is set to a value lower than that in the first reading operation to determine the threshold voltage of the selected memory cell MC. However, the voltage to be applied to the selected word line WL is kept at the reading voltages AR, BR, or CR (i.e., no shift reading operation is executed). Instead, the voltage of the source line SRC is raised from 0 V to the voltage Vsrc, and thereby the voltage between the control gate electrode and source of the memory cell is set to a value lower than the value in the first reading operation. Also according to the present embodiment, even in the second reading operation, the voltage of the control gate electrode of the selected memory cell MC is kept at 0 or a positive value.

Effect

In the reading operation according to the present embodiment, when deterioration of data retention occurs and the threshold voltage distributions broaden at the lower side, reading operation is executed by not changing the voltage to be applied to the selected word line WL from the reading voltages AR, BR, or CR but instead by raising the voltage of the source line SRC from 0 V to the voltage Vsrc. Since the reading voltages BRs and CRs are not used in the present embodiment, the number of reading voltages to be set does not increase, and a simplified control on the reading operation can be realized.

As described above, in terms of the voltage between the control gate electrode and source, raising the voltage of the source line SRC from 0 V to Vsrc is equivalent to lowering the voltage of the control gate electrode (the selected word line WL). Hence, raising the source line SRC to the voltage Vsrc results in the same state as resulting from lowering the voltages AR, BR, or CR. It is possible to execute a data reading operation on the memory cell MC correctly, by employing such a data reading scheme in the second reading operation which is executed after it is determined that correct reading is impossible by the first reading operation due to deterioration of data retention. Since the voltage to be applied to the selected memory cell MC need not to be a negative value, voltage control in the reading operation becomes easier. Furthermore, it becomes possible for the second reading operation to be executed by keeping the voltage to be applied to the source line SRC at the voltage Vsrc and not changing it, which makes it possible to reduce the time necessary for reading.

Third Embodiment

Next, a nonvolatile semiconductor memory device according to a third embodiment will be explained with reference to FIG. 13 to FIG. 17. The whole configuration of the nonvolatile semiconductor memory device according to the present embodiment is the same as the first embodiment, and hence a detailed explanation thereof will not be provided. Any portions that are configured the same as the first embodiment will be denoted by the same reference numerals, and a redundant explanation thereof will not be provided.

In the first and second embodiments, it is explained that the voltage to be applied to the source line SRC in the second reading operation is one type of voltage, that is, the voltage Vsrc. In contrast, according to the present embodiment, the voltage to be applied to the source line SRC in the second reading operation can be set to a plurality of positive values, for example, two positive values. Explanation will now be given with reference to FIG. 13 and FIG. 14.

Figure 13:
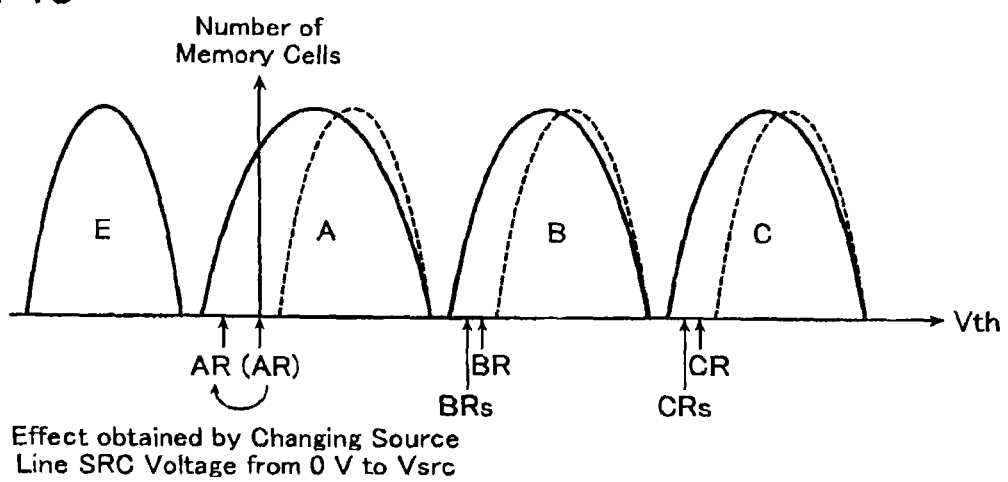
FIG. 13 is a diagram explaining threshold voltage distributions and reading voltages of a reading operation according to a third embodiment.

When the gate insulating film deteriorates due to repetitive writing and erasing operations to the memory cell MC or when a long time passes after data is written in the memory cell MC, more of the electrons retained in the charge accumulation layer are discharged to lower the threshold voltage of the memory cell MC greatly. In this case, broadening of the threshold voltage distributions due to deterioration of data retention is larger as shown in FIG. 13. Hence, there is a possibility that the threshold voltage distributions A, B, or C cannot be read out correctly even by applying the voltage Vsrc to the source line SRC in the second reading operation as explained in the first and second embodiments, because applying the voltage Vsrc might not be enough for the lower limit value of the threshold voltage distributions A, B, or C to be read out.

In the reading operation according to the third embodiment, when the gate insulation film deteriorates due to repetitive writing and erasing operations or when a long time passes after data is written, the voltage to be applied to the source line SRC in the second reading operation is changed from the voltage Vsrc to a still higher voltage Vsrc' (>Vsrc).

Figure 14:
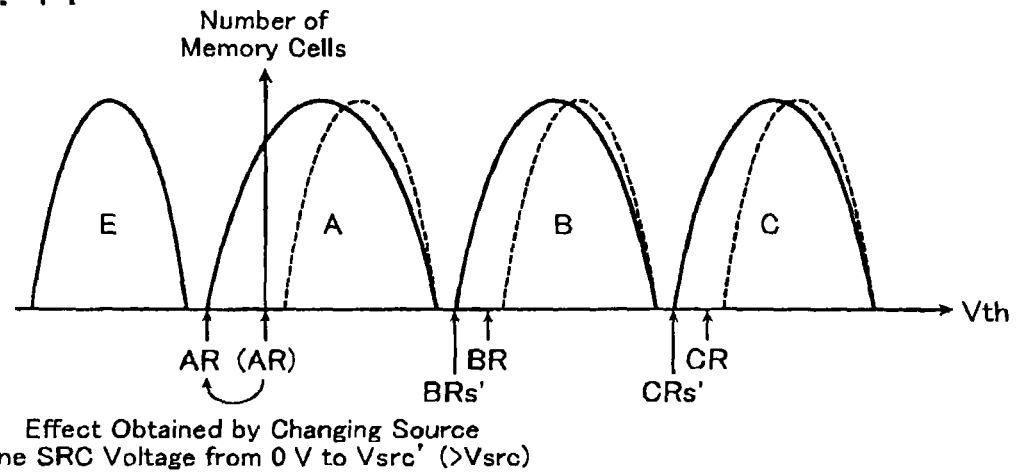
FIG. 14 is a diagram explaining threshold voltage distributions and reading voltages of a reading operation according to the third embodiment.

By adjusting the value of the voltage to be applied to the source line SRC appropriately, it is possible to manage even when data retention deteriorates greatly as shown in FIG. 14. In addition, a shift reading operation may be executed by changing the reading voltages BR or CR to voltages BRs' or CRs' (BRs'<BRs, CRs'<CRs). Determination of whether or not to change the voltage of the source line SRC to the voltage Vsrc' can be made based on the counted value of the counter 7a (FIG. 1) for counting the number of times data writing/erasing operations are executed in the memory cell MC, the counted value of the timer 7b for counting the cumulative time spent on operations on the memory cell MC, or the like. When executing the second reading operation after the counted value of the counter 7a or the timer 7b exceeds a reference value, the voltage of the source line SRC may be changed from the voltage Vsrc to the voltage Vsrc'.

Figure 15:
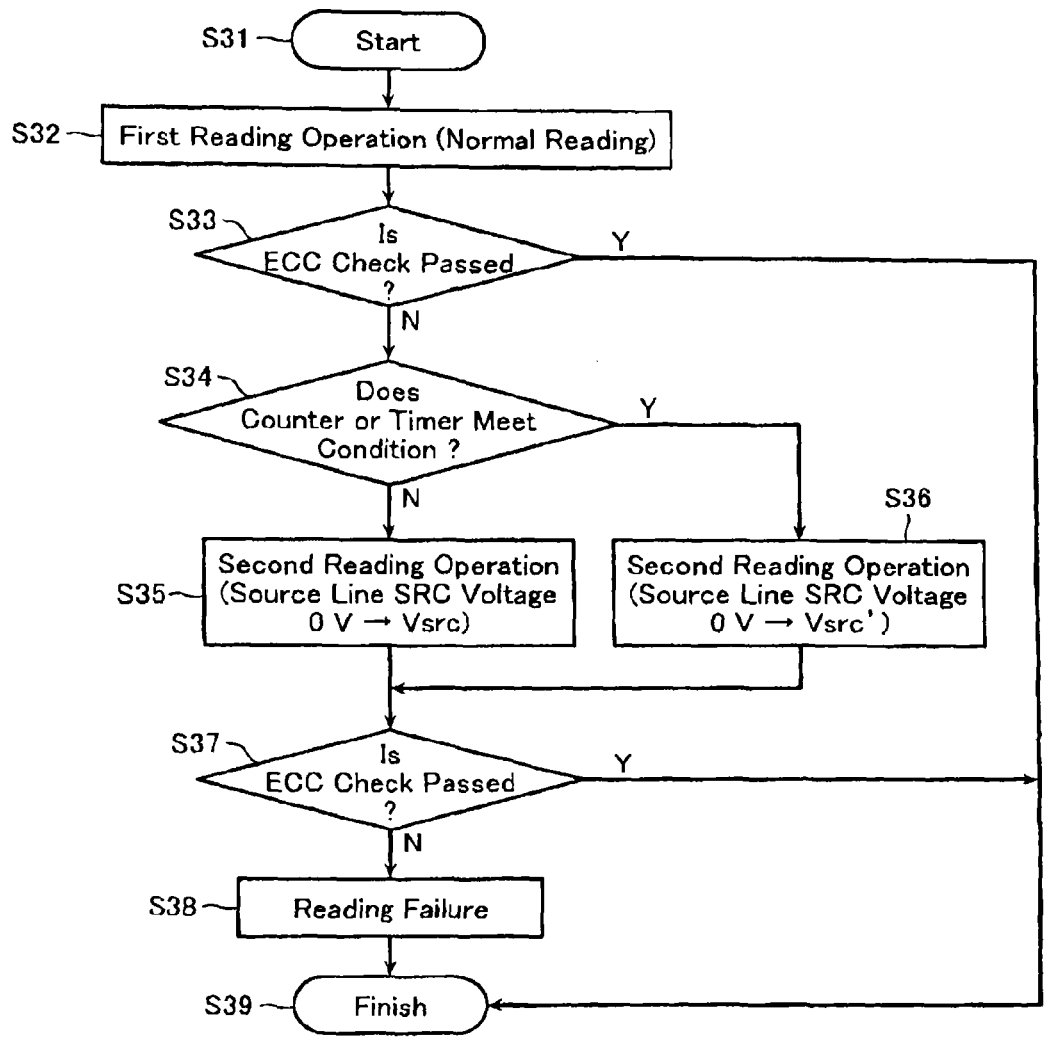
FIG. 15 is a flowchart showing a data reading process according to the third embodiment.

The process of the data reading operation according to the third embodiment will be explained with reference to FIG. 15. Step S31 to step S33 of FIG. 15 are the same as corresponding step S11 to step S13 of the first embodiment shown in FIG. 8. In the present embodiment, when it is determined by ECC check executed after the first reading operation that deterioration of data retention occurs, the counted value of the counter 7a or the timer 7b is read out (step S34). When the counted value of the counter 7a or the timer 7b is equal to or smaller than the reference value, the reading operation is executed by selecting the voltage Vsrc as the voltage of the source line SRC, by determining that broadening of the threshold voltage distributions due to deterioration of data retention is small (step S35).

On the other hand, when the counted value of the counter 7a or the timer 7b is larger than the reference value, the reading operation is executed by selecting the voltage Vsrc' as the voltage of the source line SRC, by determining that broadening of the threshold voltage distributions due to deterioration of data retention is large (step S36). Note that the value of a well voltage Vwell used in step S35 or S36 is equal to the voltage Vsrc.

After the second reading operation, ECC check is executed (step S37). When there are few reading errors and error correction is possible, the reading process is finished by determining that data reading is executed correctly (step S39). However, when even the second reading operation results in many reading errors and error correction is impossible, the reading process is finished by determining that data reading fails (step S38 and step S39).

Figure 16:
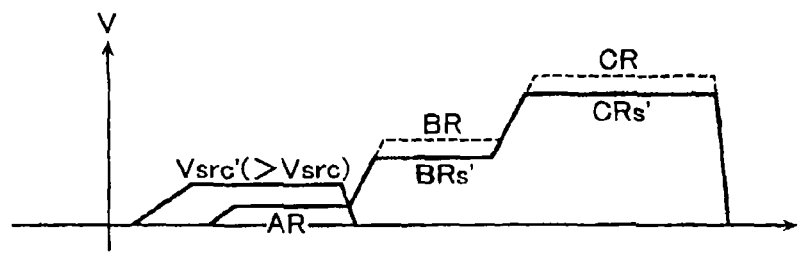
FIG. 16 is a diagram explaining voltages of a reading operation according to the third embodiment.
Figure 17:
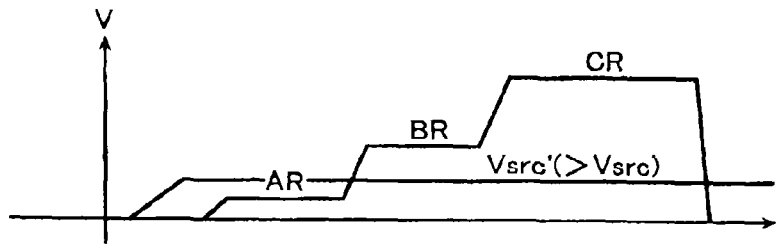
FIG. 17 is a diagram explaining voltages of a reading operation according to the third embodiment.

In step S36 of FIG. 15, the second reading operation may be executed by executing a shift reading operation by changing the reading voltages BR and CR to the voltages BRs' and CRs' (BRs'<BRs, CRs'<CRs), as shown in FIG. 16. Only when the reading voltage AR is to be applied to the selected word line WL, the voltage of the source line SRC rises to the voltage Vsrc' instead of changing the voltage value of the reading voltage AR. Alternatively, as shown in FIG. 17, the second reading operation may be executed by not changing the voltage values of the reading voltages AR, BR, and CR but raising the voltage to be applied to the source line SRC to the voltage Vsrc' regardless of which of the voltages AR, BR, and CR is to be applied to the selected word line WL. Also according to the present embodiment, the voltage of the control gate electrode of the selected memory cell MC is kept at 0 or a positive value in the second reading operation.

Effect

In the reading operation according to the present embodiment, when the threshold voltage distributions broaden, it is possible to select, based on the width of the broadening, which of the voltages Vsrc and Vsrc' to use as the voltage to be applied to the source line SRC for executing the reading operation. It is possible to execute a data reading operation on the memory cell MC correctly by employing such a data reading scheme in the second reading operation which is executed after deterioration of data retention occurs. Since the voltage to be applied to the selected memory cell MC need not to be a negative value, voltage control in the reading operation becomes easier.

Modified Example of Third Embodiment

Figure 18:
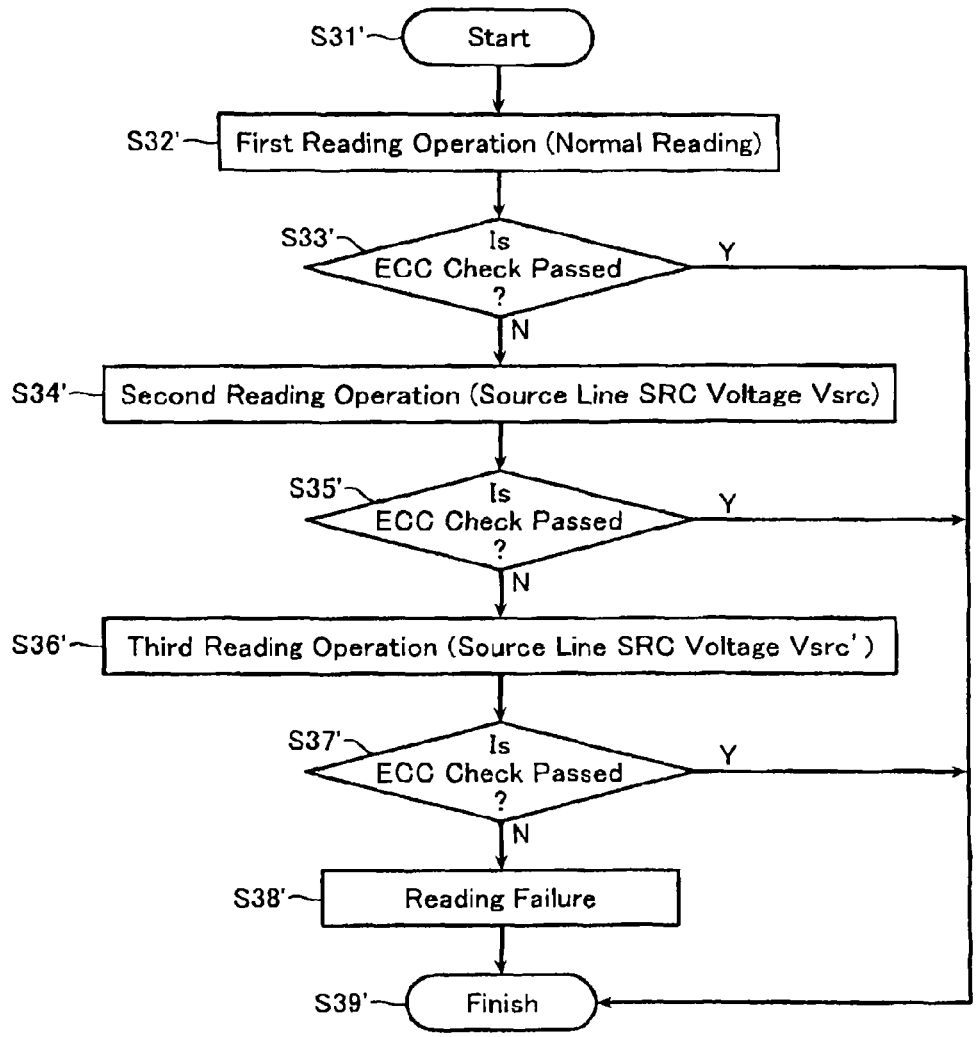
FIG. 18 is a flowchart showing a data reading process according to a modified example of the third embodiment.
Figure 19:
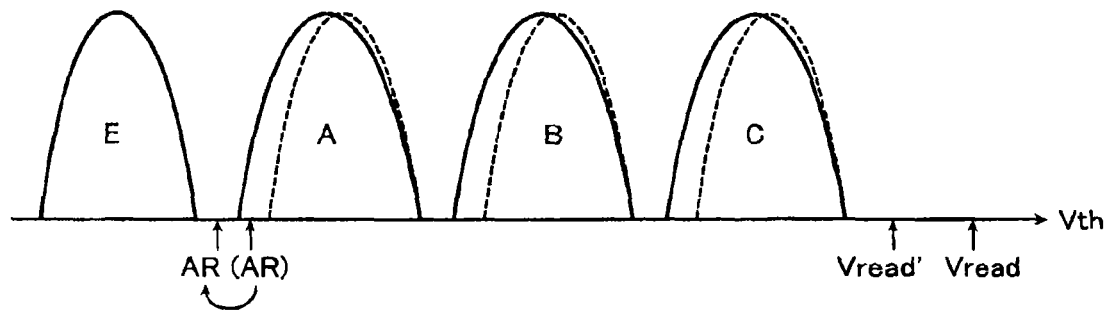
FIG. 19 is a diagram explaining threshold voltage distributions and reading voltages of a reading operation according to a fourth embodiment.

Next, a nonvolatile semiconductor memory device according to a modified example of the third embodiment will be explained with reference to FIG. 18. In the third embodiment described above, determination of whether or not to change the value of the voltage to be applied to the source line SRC in the second reading operation to the voltage Vsrc' is made based on the counted values of the counter 7a or the timer 7b, or the like. Here, determination of whether or not to change the value of the voltage to be applied to the source line SRC to the voltage Vsrc' may be made based on the result of a reading operation which is executed by setting the value of the voltage to be applied to the source line SRC to the voltage Vsrc.

The process of the data reading operation according to the modified example of the third embodiment will be explained with reference to FIG. 18. Step S31' to step S33' of FIG. 18 are the same as corresponding step S31 to step S33 of the third embodiment shown in FIG. 15. In the present embodiment, when it is determined by ECC check executed after the first reading operation that deterioration of data retention occurs, the second reading operation is executed by selecting the voltage Vsrc as the voltage of the source line SRC (step S34').

After the second reading operation, ECC check is executed (step S35'). When it is determined by this ECC check that deterioration of data retention occurs, a third reading operation is executed by selecting the voltage Vsrc' as the voltage of the source line SRC, by determining that broadening of the threshold voltage distributions due to deterioration of data retention is large (step S36'). Note that the value of a well voltage Vwell used in steps S34' and S36' is equal to the voltage Vsrc.

After the third reading operation, ECC check is executed (step S37'). When there are few reading errors and error correction is possible, the reading process is finished by determining that data reading is executed correctly (step S39'). However, when even the third reading operation results in many reading errors and error correction is impossible, the reading process is finished by determining that data reading fails (step S38' and step S39').

Effect

In the reading operation according to the present modified example, it is possible to select whether to execute reading operation by using the voltage Vsrc', based on the result of the reading operation executed by applying the voltage Vsrc to the source line SRC. By employing such a data reading scheme in the second reading operation which is executed after deterioration of data retention occurs, it is possible to execute a data reading operation on the memory cell MC correctly. Furthermore, the reading operation according to the present modified example allows data reading to be executed correctly even if the counter 7a and the timer 7b are not provided.

Fourth Embodiment

Next, a nonvolatile semiconductor memory device according to a fourth embodiment will be explained with reference to FIG. 19 to FIG. 22. The whole configuration of the nonvolatile semiconductor memory device according to the present embodiment is the same as the first embodiment, and hence a detailed explanation thereof will not be provided. Any portions that are configured the same as the first embodiment will be denoted by the same reference numerals, and a redundant explanation thereof will not be provided.

In the first to third embodiment described above, it is explained that the reading pass voltage Vread to be applied to the non-selected memory cells MC in the reading operation has a fixed value. In contrast, according to the fourth embodiment, the value of the reading pass voltage Vread used in the reading operation can be changed in accordance with the voltage to be applied to the selected word line WL. Explanation will now be given with reference to FIG. 19.

When the reading pass voltage Vread is applied to non-selected memory cells MC adjoining the selected memory cell MC in the reading operation of the selected memory cell MC (here after may be called "adjoining non-selected memory cells MC"), the threshold voltage of the selected memory cell MC seems to become lower due to the influence of the reading pass voltage Vread. When the reading pass voltage Vread is changed to a voltage Vread' (Vread>Vread'), the threshold voltage of the selected memory cell MC seems to become higher, that is, an effect that the reading voltage AR becomes lower is achieved. Not only the voltage Vsrc of the source line SRC described above but also the influence caused by applying the reading pass voltage Vread' to the adjoining non-selected memory cells MC enable the value of the reading voltage AR to be adjusted so that data reading may be executed correctly. Note that the voltage Vread' may be applied to the control gate electrodes of only the adjoining non-selected memory cells MC.

Figure 20:
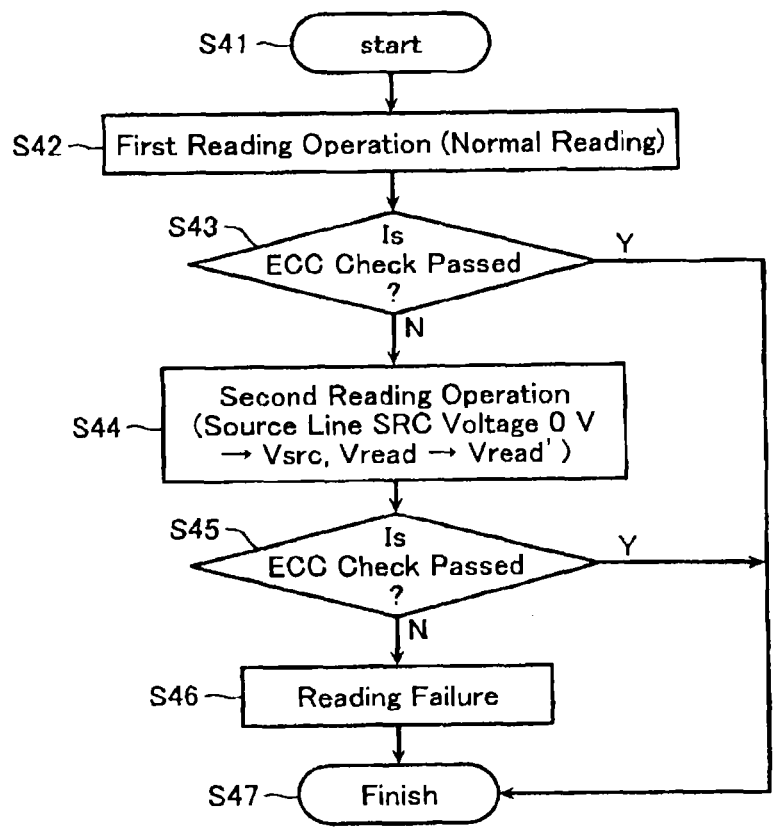
FIG. 20 is a flowchart showing a data reading process according to the fourth embodiment.

The process of the data reading operation according to the present embodiment will now be explained with reference to FIG. 20. Step S41 to step S43 of FIG. 20 are the same as corresponding step S11 to step S13 of the first embodiment shown in FIG. 8. In the second reading operation according to the present embodiment, reading operation is executed by raising the voltage of the source line SRC from 0 V to Vsrc and changing the reading pass voltage to be applied to the non-selected memory cells MC to the voltage Vread' (step S44). The value of a well voltage Vwell used in step S44 is equal to the voltage Vsrc. After the second reading operation, ECC check is executed (step S45). When there are few reading errors and error correction is possible, the reading process is finished by determining that data reading is executed correctly (step S47). However, when even the second reading operation results in many reading errors and error correction is impossible, the reading process is finished by determining that data reading fails (step S46 and step S47).

Figure 21:
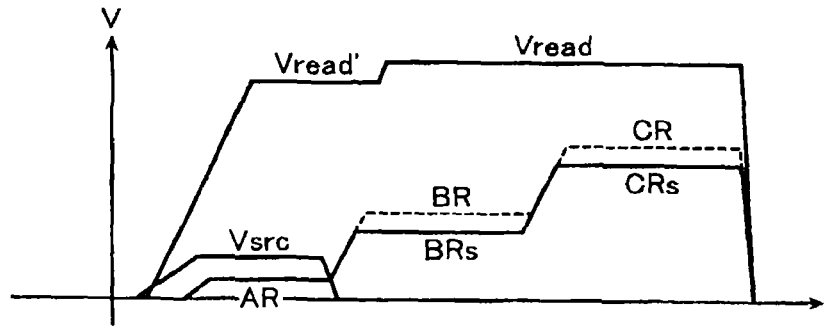
FIG. 21 is a diagram explaining voltages of a reading operation according to the fourth embodiment.
Figure 22:
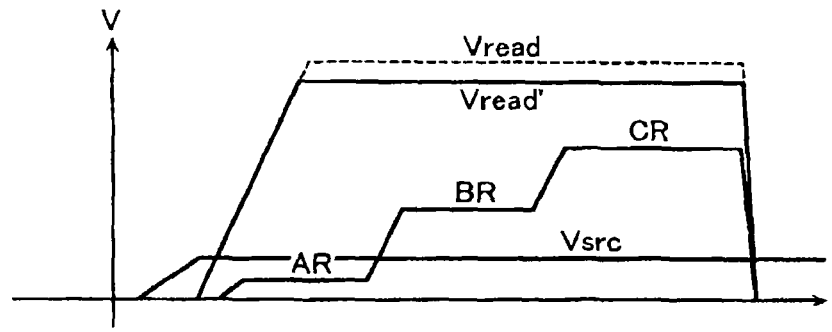
FIG. 22 is a diagram explaining voltages of a reading operation according to the fourth embodiment.

FIG. 21 and FIG. 22 are diagrams explaining the voltages to be applied in a reading operation. In the normal reading operation (first reading operation), the reading voltages AR, BR, or CR is applied to the selected word line WL. Also according to the present embodiment, in the second reading operation, the voltage between the control gate electrode and source of the selected memory cell MC is set to a value lower than that in the first reading operation to determine the threshold voltage of the selected memory cell MC.

In step S44 of FIG. 20, the second reading operation may be executed by executing a shift reading operation by changing the reading voltages BR and CR to the voltages BRs and CRs without changing the reading voltage Vread, as shown in FIG. 21. Only when the voltage AR is to be applied to the selected word line WL, the voltage of the source line SRC rises to the voltage Vsrc and the reading pass voltage Vread' is used to execute the second reading operation instead of changing the voltage value of the reading voltage AR. Alternatively, the second reading operation may be executed by not changing the voltage values of the reading voltages AR, BR, and CR but raising the voltage to be applied to the source line SRC to the voltage Vsrc and using the reading pass voltage Vread' regardless of which of the voltages AR, BR, and CR is to be applied to the selected word line WL, as shown in FIG. 22. Also according to the present embodiment, the voltage of the control gate electrode of the selected memory cell MC is kept at 0 or a positive value in the second reading operation.

Effect

In the reading operation according to the present embodiment, it is possible to select which of the reading pass voltages Vread and Vread' to use for executing reading operation. The values of the reading voltages can be adjusted based also on the level of the values of the reading pass voltages Vread and Vread'. By employing such a data reading scheme in the second reading operation, it is possible to execute a data reading operation on the memory cell MC correctly. Since the voltage to be applied to the selected memory cell MC need not to be a negative value, voltage control in the reading operation becomes easier.

Furthermore, since the voltage of the control gate electrode of the non-selected memory cells MC can be lowered, it is possible to prevent false writing due to so-called read disturb.

Fifth Embodiment

Next, a nonvolatile semiconductor memory device according to a fifth embodiment will be explained with reference to FIG. 23 to FIG. 25. The whole configuration of the nonvolatile semiconductor memory device according to the present embodiment is the same as the first embodiment, and a detailed explanation thereof will not be provided. Any portions that are configured the same as the first embodiment will be denoted by the same reference numerals, and a redundant explanation thereof will not be provided.

According to the present embodiment, the value of a well voltage Vwell used in the reading operation to be applied to the memory cell MC can be changed in accordance with the voltage to be applied to the selected word line WL. Normally, the well voltage Vwell is set to a voltage equal to the voltage of the source line SRC. However, raising the voltage of the source line SRC from 0 V to the voltage Vsrc and lowering the value of the well voltage Vwell in the reading operation results in the same state as a state in which a back-gate bias is applied. In this case, the threshold voltage of the selected memory cell MC seems to become higher. Not only changing the voltage Vsrc of the source line SRC described above but also changing of the well voltage Vwell enable the value of the reading voltage to be adjusted so that data reading may be executed correctly.

The process of the data reading operation according to the present embodiment will now be explained with reference to FIG. 23. Step S51 to step S53 of FIG. 23 are the same as corresponding step S11 to step S13 of the first embodiment shown in FIG. 8. In the second reading operation according to the present embodiment, reading operation is executed by raising the voltage of the source line SRC from 0 V to the voltage Vsrc and changing the well voltage Vwell (step S54). After the second reading operation, ECC check is executed (step S55). When there are few reading errors and error correction is possible, the reading process is finished by determining that data reading is executed correctly (step S57). However, when even the second reading operation results in many reading errors and error correction is impossible, the reading process is finished by determining that data reading fails (step S56 and step S57).

Figure 24:
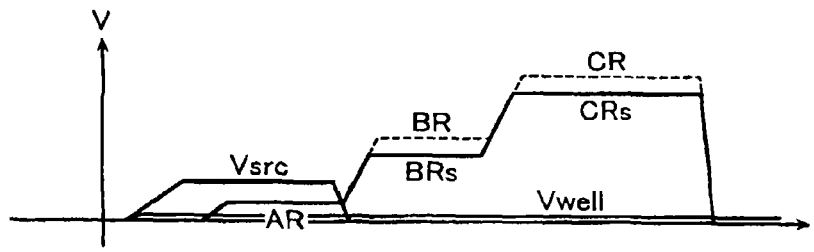
FIG. 24 is a diagram explaining voltages of a reading operation according to the fifth embodiment.
Figure 25:
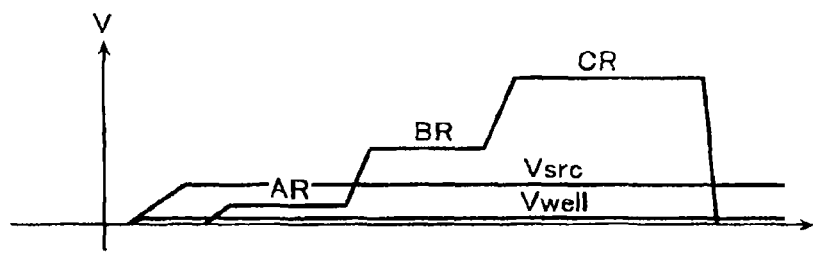
FIG. 25 is a diagram explaining voltages of a reading operation according to the fifth embodiment.

FIG. 24 and FIG. 25 are diagrams explaining the voltages to be applied in the reading operation. In the normal reading operation (first reading operation), the reading voltages AR, BR, or CR is applied to the selected word line WL. Also according to the present embodiment, in the second reading operation, the voltage between the control gate electrode and source of the selected memory cell MC is set to a value lower than that in the first reading operation to determine the threshold voltage of the selected memory cell.

Figure 23:
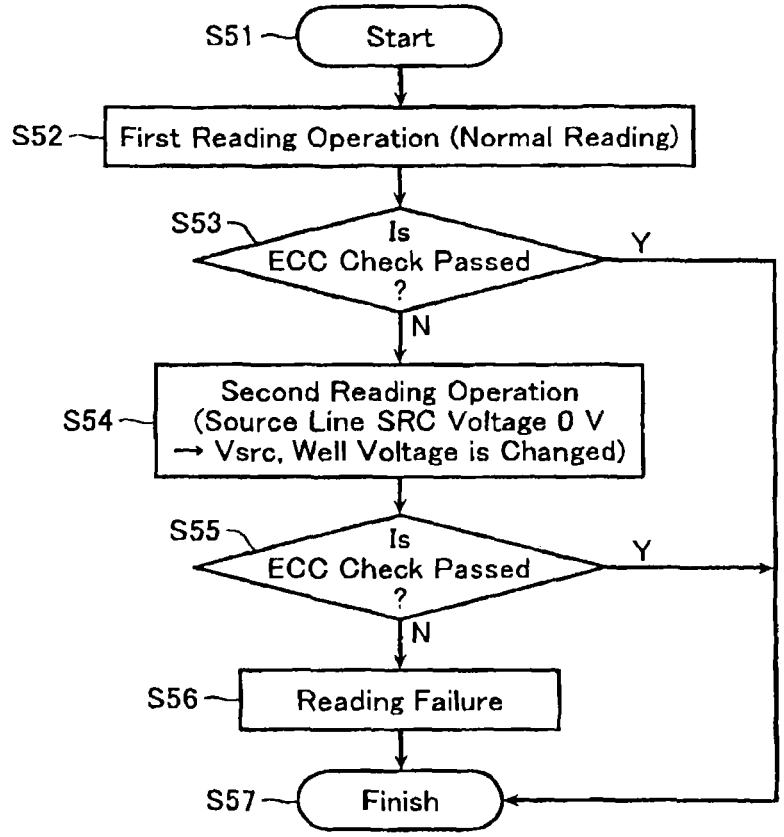
FIG. 23 is a flowchart showing a data reading process according to a fifth embodiment.

In step S54 of FIG. 23, the second reading operation may be executed by executing a shift reading operation by changing the reading voltages BR and CR to the voltages BRs and CRs, as shown in FIG. 24. Only when the voltage AR is to be applied to the selected word line WL, the voltage of the source line SRC rises to the voltage Vsrc instead of changing the voltage value of the reading voltage AR. In this case, when the well voltage Vwell is lowered to below the source line voltage Vsrc, the threshold voltage of the selected memory cell MC seems to become higher. Alternatively, the second reading operation may be executed by not changing the voltage values of the reading voltages AR, BR, and CR but raising the voltage to be applied to the source line SRC to the voltage Vsrc and lowering the well voltage Vwell to below the voltage Vsrc regardless of which of the voltages AR, BR, and CR is to be applied to the selected word line WL, as shown in FIG. 25. Also according to the present embodiment, the voltage of the control gate electrode of the selected memory cell MC is kept at 0 or a positive value in the second reading operation.

Effect

In the reading operation according to the present embodiment, reading operation is executed by raising the voltage of the source line SRC to the voltage Vsrc and lowering the well voltage Vwell. Lowering the well voltage Vwell makes the threshold voltage of the selected memory cell seem to become higher. By employing such a data reading scheme in the second reading operation, it is possible to execute the data reading operation on the memory cell MC correctly. Since the voltage to be applied to the selected memory cell MC need not to be a negative value, voltage control in the reading operation becomes easier.

Furthermore, lowering the well voltage Vwell enables the time required for charging the well to be reduced. This leads to an improved operation speed.

Sixth Embodiment

Figure 26:
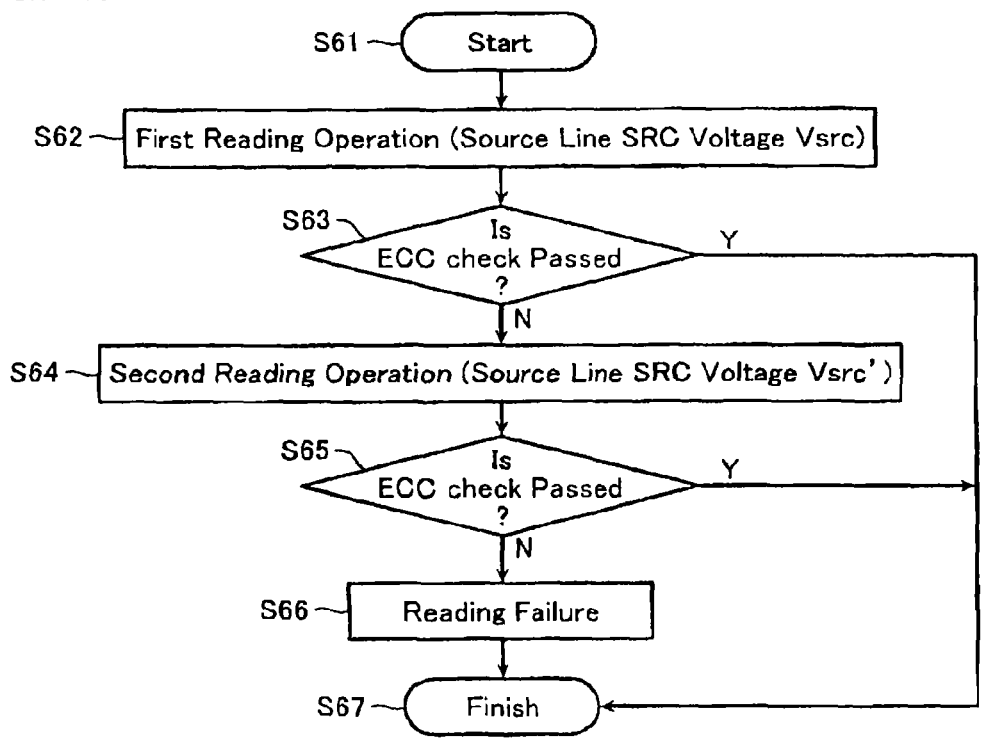
FIG. 26 is a flowchart showing a data reading process according to a sixth embodiment.

Next, a nonvolatile semiconductor memory device according to a sixth embodiment will be explained with reference to FIG. 26 and FIG. 27. The whole configuration of the nonvolatile semiconductor memory device according to the present embodiment is the same as the first embodiment, and hence a detailed explanation thereof will not be provided. Any portions that are configured the same as the first embodiment will be denoted by the same reference numerals, and a redundant explanation thereof will not be provided.

In the first to fifth embodiments described above, the voltage to be applied to the source line SRC in the first reading operation is set to 0 V, and the voltage to be applied to the source line SRC in the second reading operation is set to the voltage Vsrc or the voltage Vsrc' (Vsrc'>Vsrc). Here, the first reading operation is not limited the normal reading operation in which the voltage of the source line SRC is set to 0 V. In the first reading operation, it is only necessary that the voltage between the control gate electrode and source of the selected memory cell MC be set to a value higher than that in the second reading operation. Hence, according to the sixth embodiment, the reading operation is executed by setting the voltage to be applied to the source line SRC in the first reading operation to the voltage Vsrc and the voltage to be applied to the source line SRC in the second reading operation to the voltage Vsrc'.

The process of the data reading operation according to the present embodiment will be explained with reference to FIG. 26. First, when a reading signal sent from external is input to the control circuit 7, the data reading process is started (step S61). Next, the first reading operation is executed by applying the voltage Vsrc to the source line SRC (step S62). The value of the well voltage Vwell used in step S62 is equal to the voltage Vsrc. After the first reading operation, ECC check is executed (step S63). When there are few reading errors and error correction is possible, the data reading process is finished by determining that data reading is executed correctly (step S67). In the second reading operation executed after the first reading operation fails, reading operation is executed by raising the voltage of the source line SRC from the voltage Vsrc to the voltage Vsrc' (step S64). The value of the well voltage Vwell used in step S64 is equal to the voltage Vsrc'.

After the second reading operation, ECC check is executed (step S65). When there are few reading errors and error correction is possible, the reading process is finished by determining that data reading is executed correctly (step S67). However, when even the second reading operation results in many reading errors and error correction is impossible, the reading process is finished by determining that data reading fails (step S66 and step S67).

Figure 27:
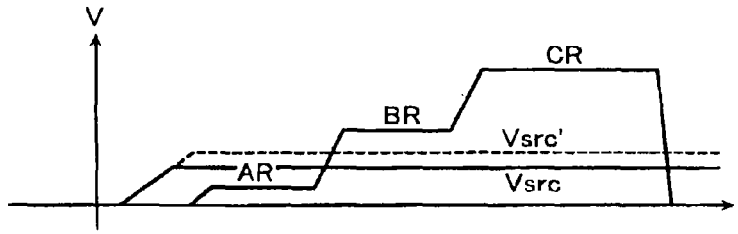
FIG. 27 is a diagram explaining voltages of a reading operation according to the sixth embodiment.
Figure 28:
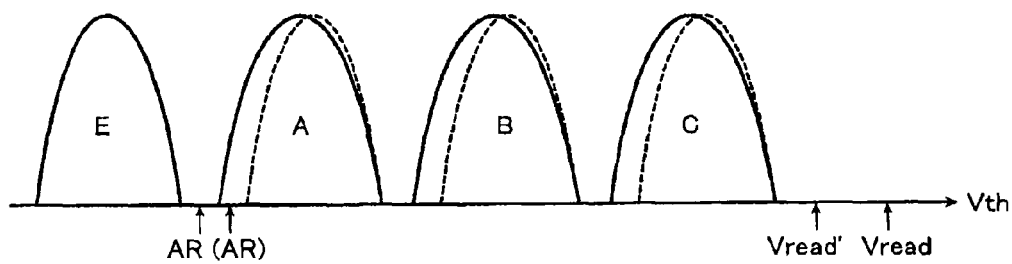
FIG. 28 is a diagram explaining threshold voltage distributions and reading voltages of a reading operation according to a seventh embodiment.

FIG. 27 is a diagram explaining the voltages to be applied in the reading operation. In the first reading operation, the reading voltages AR, BR, or CR are applied to the selected word line WL, and the voltage Vsrc is applied to the source line SRC. In the second reading operation, the voltage of the source line SRC is raised from the voltage Vsrc to the voltage Vsrc' to execute reading operation. According to the present embodiment, the voltage of the control gate electrode of the selected memory cell MC is kept at 0 or a positive value in the first and second reading operations.

Effect

In the reading operation according to the present embodiment, the voltage Vsrc or the voltage Vsrc' is applied as the voltage of the source line SRC for executing reading operation. By employing such a data reading scheme, it is possible to execute reading without setting the reading voltage AR to a negative value, even when the threshold voltage distribution A has negative voltage at the lower side under a condition that no deterioration of data retention occurs. Further, when deterioration of data retention occurs, the voltage Vsrc' (>Vsrc) is used as the voltage of the source line SRC, allowing the data reading operation on the memory cell MC to be executed correctly. Since the voltage to be applied to the selected memory cell MC need not to be a negative value, voltage control in the reading operation becomes easier.

Furthermore, when deterioration of data retention occurs, the reading operation may be skipped, and the normal reading operation using the voltage Vsrc may be performed. Then, it is possible to reduce the time of the data reading operation.

Seventh Embodiment

Next, a nonvolatile semiconductor memory device according to a seventh embodiment will be explained with reference to FIG. 28 to FIG. 31. The whole configuration of the nonvolatile semiconductor memory device according to the present embodiment is the same as the first embodiment, and hence a detailed explanation thereof will not be provided. Any portions that are configured the same as the first embodiment will be denoted by the same reference numerals, and a redundant explanation thereof will not be provided.

In the fourth embodiment described above, it is explained that the operation of changing the reading pass voltage Vread to the voltage Vread' is executed together with the operation of raising the voltage of the source line SRC to the voltage Vsrc. In contrast, according to the present embodiment, the value of the reading pass voltage Vread is changed without changing the voltage to be applied to the source line SRC. Explanation will now be given with reference to FIG. 28.

In the reading operation on the selected memory cell MC, when the reading pass voltage Vread is applied to the adjoining non-selected memory cells MC, the threshold voltage of the selected memory cell MC seems to become lower due to the influence of the reading pass voltage Vread. When the reading pass voltage Vread is changed to the voltage Vread' (Vread>Vread'), the threshold voltage of the selected memory cell MC seems to become higher, that is, an effect that the reading voltage AR becomes lower is achieved. Only the influence caused by applying the reading pass voltage Vread' to the adjoining non-selected memory cells MC without any other effect also enables the value of the reading voltage AR to be adjusted so that data reading for the threshold voltage distribution A can be executed correctly.

Figure 29:
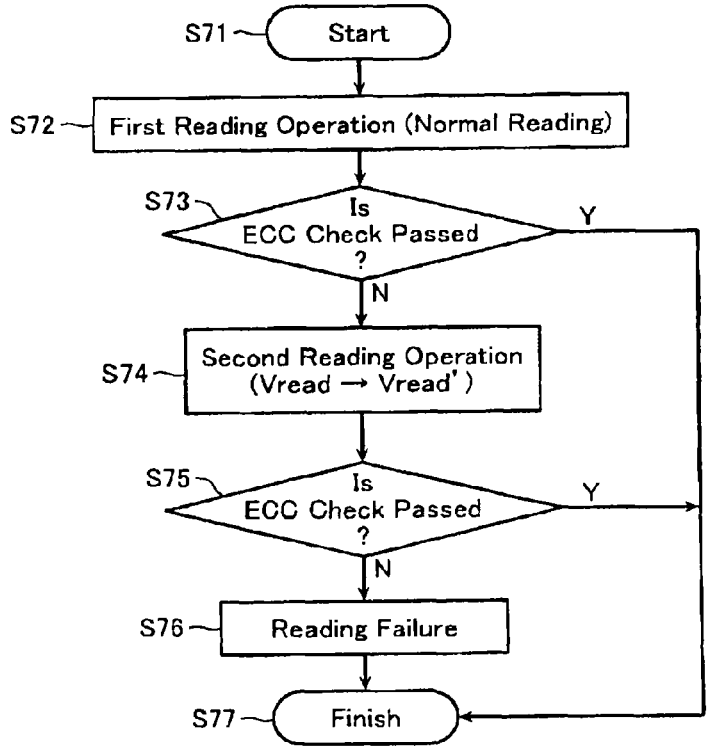
FIG. 29 is a flowchart showing a data reading process according to the seventh embodiment.

The process of the data reading operation according to the present embodiment will be explained with reference to FIG. 29. Step S71 to step S73 of FIG. 29 are the same as corresponding step S41 to step S43 of the fourth embodiment shown in FIG. 20. In the second reading operation according to the present embodiment, reading operation is executed by changing the reading pass voltage to be applied to the non-selected memory cells MC to the voltage Vread' without raising the voltage of the source line SRC from 0 V (step S74). The value of the well voltage Vwell used in step S74 is equal to the voltage Vsrc. After the second reading operation, ECC check is executed (step S75). When there are few reading errors and error correction is possible, the reading process is finished by determining that data reading is executed correctly (step S77). However, when even the second reading operation results in many reading errors and error correction is impossible, the reading process is finished by determining that data reading fails (step S76 and step S77).

Figure 30:
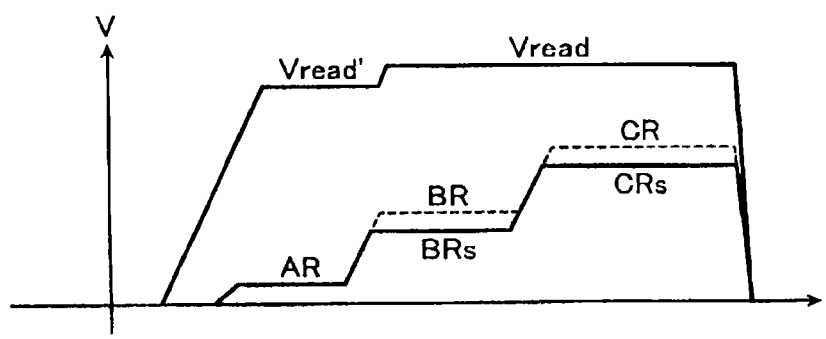
FIG. 30 is a diagram explaining voltages of a reading operation according to the seventh embodiment.
Figure 31:
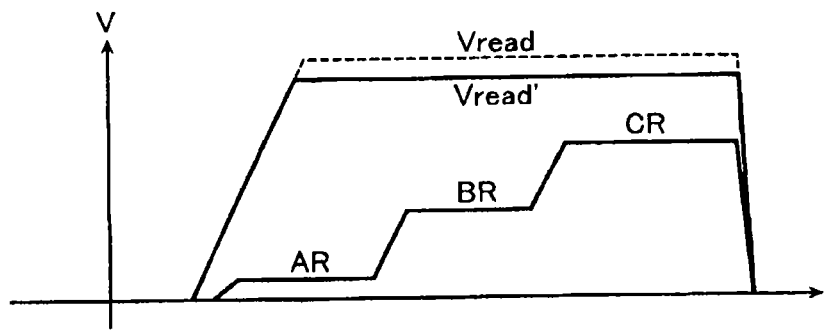
FIG. 31 is a diagram explaining voltages of a reading operation according to the seventh embodiment.

FIG. 30 and FIG. 31 are diagrams explaining the voltages to be applied in the reading operation. In the normal reading operation (first reading operation), the reading voltages AR, BR, or CR are applied to the selected word line WL. In step S74 of FIG. 29, the second reading operation may be executed by executing a shift reading operation by changing the voltages BR and CR to the voltages BRs and CRs without changing the reading pass voltage Vread, as shown in FIG. 30. Only when the reading voltage AR is to be applied to the selected word line WL, the reading pass voltage Vread' is used instead of changing the voltage value of the reading voltage AR. Alternatively, the second reading operation may be executed by not changing the voltage values of the reading voltages AR, BR, and CR but by using the reading pass voltage Vread' regardless of which of the voltages AR, BR, and CR is to be applied to the selected word line WL, as shown in FIG. 31. Also according to the present embodiment, the voltage of the control gate electrode of the selected memory cell MC is kept at 0 or a positive value in the second reading operation.

Effect

In the reading operation according to the present embodiment, it is possible to select which of the reading pass voltages Vread and Vread' to use for executing reading operation. The value of the reading voltage can be adjusted based also on the level of the values of the reading pass voltages Vread and Vread'. By employing such a data reading scheme in the second reading operation, it is possible to execute the data reading operation on the memory cell MC correctly. Since the voltage to be applied to the selected memory cell MC need not to be a negative value, voltage control in the reading operation becomes easier.

Others

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, the embodiments described above explain a nonvolatile semiconductor memory device of a four-value storing system (2 bits/cell). However, the present invention is not limited to this, but needless to say, can be applied to a storing system for more bits, such as an eight-value storing system.

What is claimed is:

1. A nonvolatile semiconductor memory device comprising:
   a memory cell array which comprises: a memory string having a plurality of memory cells connected in series therein, each of the memory cells being configured capable of having formed therein a first threshold voltage distribution, a second threshold voltage distribution, a third threshold voltage distribution and a fourth threshold voltage distribution that are respectively assigned to data of four values to be stored in each of the memory cells and that have values ascending in an order of the first, second, third and fourth threshold voltage distributions; a first select transistor connected to one end of the memory string; a second select transistor connected to the other end of the memory string; a bit line connected to the memory string via the first select transistor; a source line connected to the memory string via the second select transistor; and a word line connected to a control gate electrode of each of the memory cells; and a control circuit configured to apply a reading voltage to the control gate electrode of a selected memory cell in the memory string to determine whether the selected memory cell is conductive or not, and thereby execute data reading of the selected memory cell, the control circuit being configured capable of, when reading a threshold voltage set in the selected memory cell, executing a first reading operation, the first reading operation including setting a value of the reading voltage of the control gate electrode relative to a voltage of a source of the selected memory cell to a first value and thereby determining whether the threshold voltage of the selected memory cell is in a range within the second threshold voltage distribution and over the second threshold voltage distribution; and when reading the threshold voltage set in the selected memory cell, executing a second reading operation, the second reading operation including setting the value of the reading voltage of the control gate electrode relative to the voltage of the source of the selected memory cell to a second value which is smaller than the first value, while applying to the source line a source line voltage of a positive voltage value, and thereby determining whether the threshold voltage of the selected memory cell is in the range within the second threshold voltage distribution and over the second threshold voltage distribution.

2. The nonvolatile semiconductor memory device according to claim 1, wherein
the control circuit is configured to set the reading voltage of the control gate electrode of the selected memory cell at a positive value when executing the second reading operation.

3. The nonvolatile semiconductor memory device according to claim 1, wherein
the control circuit is configured to apply a well voltage to a well where the memory cells are formed when executing the second reading operation, the well voltage having a voltage value which is lower than that of the source line voltage.

4. The nonvolatile semiconductor memory device according to claim 1, wherein
the control circuit is configured to apply to the source line a source line voltage of a positive voltage value when executing the first reading operation.

5. The nonvolatile semiconductor memory device according to claim 1, wherein
the control circuit is configured to, when executing each of the first reading operation and the second reading operation, further determine whether the threshold voltage of the selected memory cell is in a range within the third threshold voltage distribution and over the third threshold voltage distribution and determine whether the threshold voltage of the selected memory cell is in a range within the fourth threshold voltage distribution and over the fourth threshold voltage distribution, and in any of a case of determining whether the threshold voltage of the selected memory cell is in the range within the second threshold voltage distribution and over the second threshold voltage distribution, determining whether the threshold voltage of the selected memory cell is in the range within the third threshold voltage distribution and over the third threshold voltage distribution, and determining whether the threshold voltage of the selected memory cell is in the range within the fourth threshold voltage distribution and over the fourth threshold voltage distribution, set such that the value of the reaing voltage of the control gate electrode relative to the voltage of the source of the selected memory cell is smaller during the second reading operation than during the first reading operation.

6. The nonvolatile semiconductor memory device according to claim 5, wherein
in any of a case of determining whether the threshold voltage of the selected memory cell is in the range within the second threshold voltage distribution and over the second threshold voltage distribution, determining whether the threshold voltage of the selected memory cell is in the range within the third threshold voltage distribution and over the third threshold voltage distribution, and determining whether the threshold voltage of the selected memory cell is in the range within the fourth threshold voltage distribution and over the fourth threshold voltage distribution during the second reading operation,
the control circuit is configured to apply the same positive voltage value to the source line.

7. The nonvolatile semiconductor memory device according to claim 5, wherein
the control circuit is configured to apply to the source line a source line voltage of a positive voltage value when executing the first reading operation.

8. The nonvolatile semiconductor memory device according to claim 1, wherein
the control circuit is configured to execute the second reading operation by selecting, as the second value set for the value of the reading voltage, one of a plurality of voltage values that are each smaller than the first value and different from each other.

9. The nonvolatile semiconductor memory device according to claim 1, wherein
the control circuit is configured to execute the second reading operation when it is determined that correct reading is impossible by the first reading operation.

10. The nonvolatile semiconductor memory device according to claim 1, wherein
the control circuit is configured to execute the second reading operation when a result of the first reading operation cannot be error-corrected by ECC.

11. A nonvolatile semiconductor memory device comprising:
a memory cell array which comprises: a memory string having a plurality of memory cells connected in series therein; a first select transistor connected to one end of the memory string; a second select transistor connected to the other end of the memory string; a bit line connected to the memory string via the first select transistor; a source line connected to the memory string via the second select transistor; and a word line connected to a control gate electrode of each of the memory cells; and a control circuit configured to apply a reading voltage to the control gate electrode of a selected memory cell in the memory string to determine whether the selected memory cell is conductive or not, and thereby execute data reading of the selected memory cell, the control circuit being configured capable of executing a first reading operation configured to set a value of the reading voltage of the control gate electrode relative to a voltage of a source of the selected memory cell to a first value and thereby read a threshold voltage set in the selected memory cell, executing a second reading operation configured to set the value of the reading voltage of the control gate electrode relative to the voltage of the source of the selected memory cell to a second value which is smaller than the first value, while applying to the source line a source line voltage of a positive voltage value, and thereby read the threshold voltage set in the selected memory cell, and executing a third reading operation configured to set the value of the reading voltage of the control gate electrode relative to the voltage of the source of the selected memory cell to a third value which is smaller than the second value, while applying to the source line a source line voltage of a positive voltage value, and thereby read the threshold voltage set in the selected memory cell.

12. The nonvolatile semiconductor memory device according to claim 11, wherein
the control circuit is configured to set the reading voltage of the control gate electrode of the selected memory cell at a positive value when executing the second reading operation and the third reading operation.

13. The nonvolatile semiconductor memory device according to claim 11, wherein
the control circuit is configured to apply a well voltage to a well where the memory cells are formed when executing the second reading operation, the well voltage having a voltage value which is lower than that of the source line voltage.

14. The nonvolatile semiconductor memory device according to claim 11, wherein
the control circuit is configured to execute the second reading operation when it is determined that correct reading is impossible by the first reading operation.

15. The nonvolatile semiconductor memory device according to claim 14, wherein
the control circuit is configured to execute the third reading operation when it is determined that correct reading is impossible by the second reading operation.

16. The nonvolatile semiconductor memory device according to claim 11, wherein
the control circuit is configured to execute the second reading operation when a result of the first reading operation cannot be error-corrected by ECC.

17. The nonvolatile semiconductor memory device according to claim 16, wherein
the control circuit is configured to execute the third reading operation when a result of the second reading operation cannot be error-corrected by ECC.

18. A nonvolatile semiconductor memory device comprising:

a memory cell array which comprises: a memory string having a plurality of memory cells connected in series therein, each of the memory cells being configured capable of having formed therein a first threshold voltage distribution, a second threshold voltage distribution, a third threshold voltage distribution and a fourth threshold voltage distribution that are respectively assigned to data of four values to be stored in each of the memory cells and that have values ascending in an order of the first, second, third and fourth threshold voltage distributions; a first select transistor connected to one end of the memory string; a second select transistor connected to the other end of the memory string; a bit line connected to the memory string via the first select transistor; a source line connected to the memory string via the second select transistor; and a word line connected to a control gate electrode of each of the memory cells; and a control circuit configured to apply a reading voltage to the control gate electrode of a selected memory cell in the memory string to determine whether the selected memory cell is conductive or not, and thereby execute data reading of the selected memory cell, the control circuit being configured capable of executing a first reading operation and a second reading operation when reading the threshold voltage set in the selected memory cell, the first reading operation including setting a value of the reading voltage of the control gate electrode relative to a voltage of a source of the selected memory cell to a first value and thereby determining whether the threshold voltage of the selected memory cell is in a range within the second threshold voltage distribution and over the second threshold voltage distribution; and the second reading operation including setting the value of the reading voltage of the control gate electrode relative to the voltage of the source of the selected memory cell to a second value which is smaller than the first value, while setting the reading voltage of the control gate electrode of the selected memory cell at a positive value, and thereby determining whether the threshold voltage of the selected memory cell is in the range within the second threshold voltage distribution and over the second threshold voltage distribution.

19. The nonvolatile semiconductor memory device according to claim 18, wherein
the control circuit is configured capable of further executing a third reading operation when reading the threshold voltage set in the selected memory cell, the third reading operation including setting the value of the reading voltage of the control gate electrode relative to the voltage of the source of the selected memory cell to a third value which is smaller than the second value, while setting the reading voltage of the control gate electrode of the selected memory cell at a positive value, and thereby determining whether the threshold voltage of the selected memory cell is in the range within the second threshold voltage distribution and over the second threshold voltage distribution.

20. The nonvolatile semiconductor memory device according to claim 18, wherein
the control circuit is configured to execute the second reading operation when it is determined that conect reading is impossible by the first reading operation.

* * * * *